US007209983B2

United States Patent
Au et al.

(10) Patent No.: US 7,209,983 B2
(45) Date of Patent: Apr. 24, 2007

(54) SEQUENTIAL FLOW-CONTROL AND FIFO MEMORY DEVICES THAT ARE DEPTH EXPANDABLE IN STANDARD MODE OPERATION

(75) Inventors: Mario Au, Fremont, CA (US); Jiann-Jeng Duh, San Jose, CA (US); Tze-yuan Fang, Campbell, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 560 days.

(21) Appl. No.: 10/721,974

(22) Filed: Nov. 24, 2003

(65) Prior Publication Data

US 2005/0005082 A1  Jan. 6, 2005

Related U.S. Application Data

(63) Continuation-in-part of application No. 10/612,849, filed on Jul. 3, 2003, now Pat. No. 7,076,610.

(60) Provisional application No. 60/520,356, filed on Nov. 14, 2003.

(51) Int. Cl.
*G06F 12/00* (2006.01)
*G06F 13/00* (2006.01)
(52) U.S. Cl. .................... 710/52; 710/57; 711/170
(58) Field of Classification Search ............... None
See application file for complete search history.

(56) References Cited

U.S. PATENT DOCUMENTS 5,640,515 A * 6/1997 Park ..................... 710/52
6,055,588 A * 4/2000 Steinmetz et al. ........... 710/52
6,442,657 B1 * 8/2002 Fan et al. .................. 711/156
6,907,479 B2 * 6/2005 Karnstedt et al. ............ 710/52
2005/0041450 A1 * 2/2005 Duh et al. .................... 365/1

OTHER PUBLICATIONS

Averlogic, AL4CS205, AL4CS215, AL4CS225, AL4CS235, AL4CS245 Data Sheets, Version 2.1, Feb. 20, 2003, 39 pages.
Cypress Semiconductor Corporation, Designing with CY7C436xx Synchronous FIFOs, Aug. 4, 2000, 10 pages.
"3.3 Volt CMOS SyncFIFO™ IDT72V205", IDT, Santa Clara, CA, Feb. 2002, 25 pages.
Invitation to Pay Additional Fees, Annex to Form PCT/ISA/206, Communication Relating to the Results of the Partial International Search, PCT/US04/19152, Oct. 27, 2004.
Notification of Transmittal of the International Search Report and the Written Opinion of the International Searching Authority, or the Declaration, PCT/US2004/019151, Jan. 31, 2005.

(Continued)

*Primary Examiner*—Gary Portka
(74) *Attorney, Agent, or Firm*—Myers Bigel Sibley & Sajovec PA

(57) ABSTRACT

FIFO memory devices are configured to support a pair of hybrid operating modes that enable the FIFO memory device to be depth-expandable with other FIFO memory devices in a collective standard mode of operation. The pair of hybrid operating modes including a first hybrid mode that supports a write interface configured in standard mode and a read interface configured in first-word fall-through (FWFT) mode and a second hybrid mode that supports a write interface configured in FWFT mode and a read interface configured in standard mode.

12 Claims, 20 Drawing Sheets

OTHER PUBLICATIONS

International Preliminary Report on Patentability, PCT/US2004/019151, Sep. 19, 2005.

Response to First Written Opinion, PCT/US2004/019151, Feb. 15, 2005.

* cited by examiner

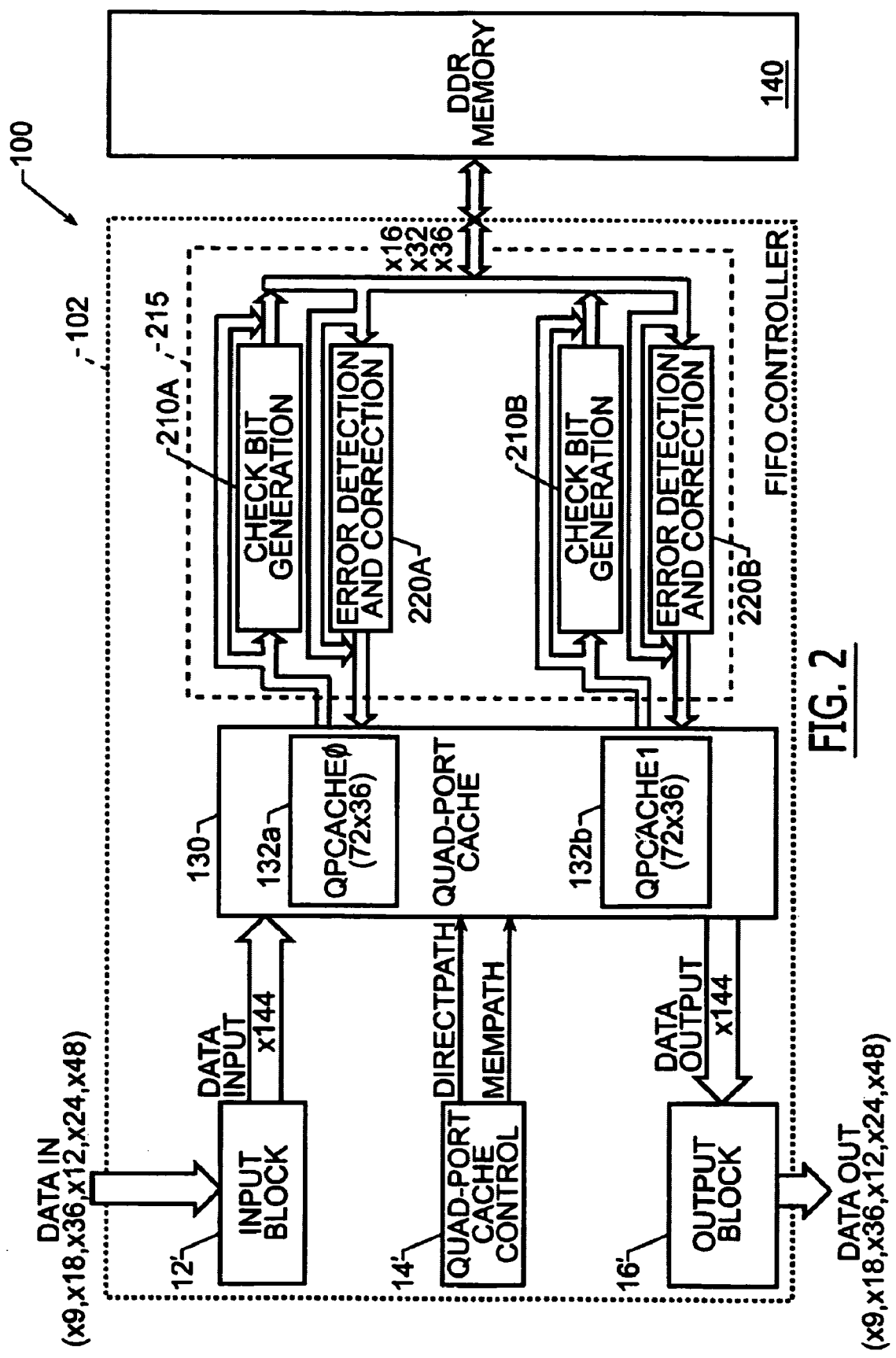

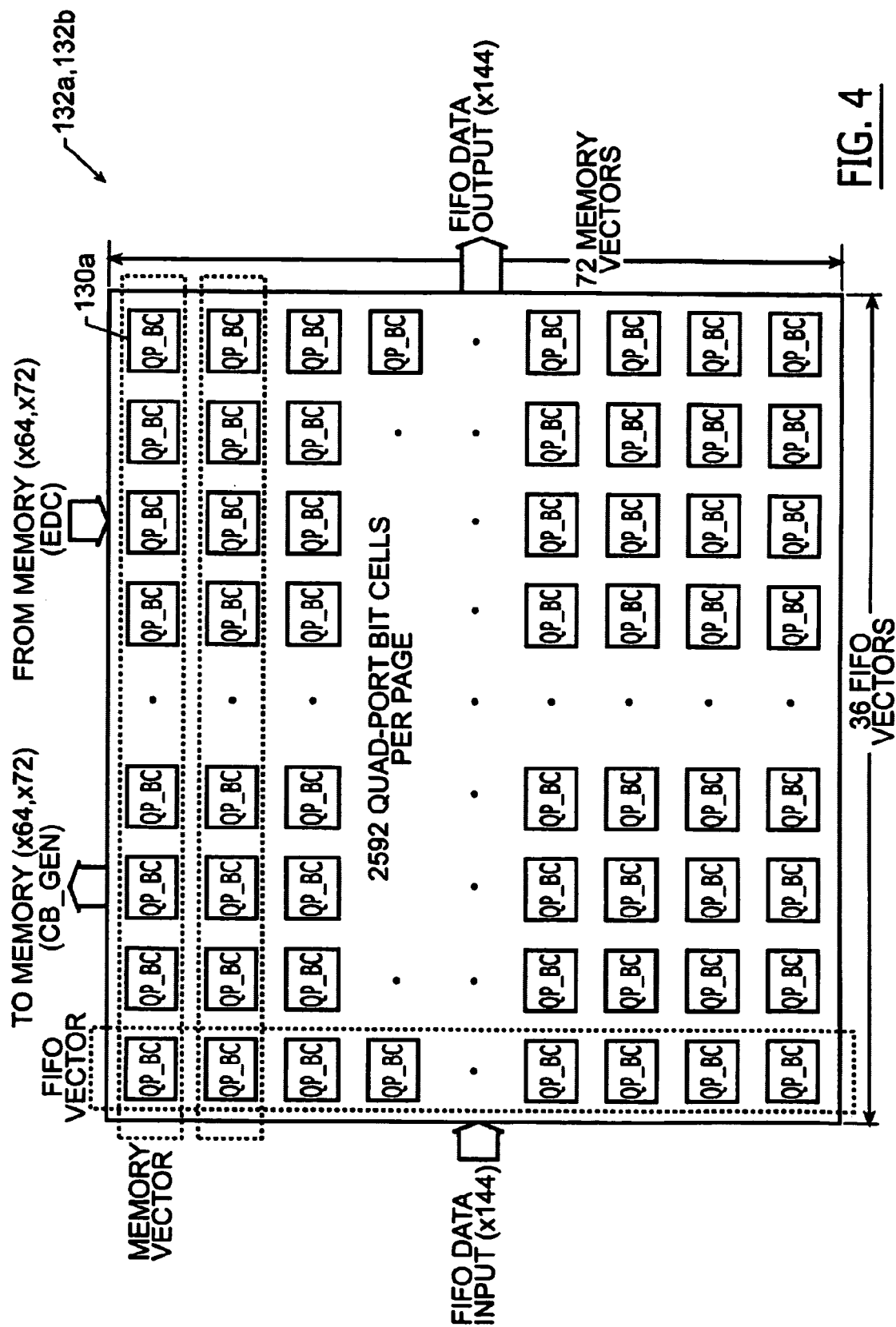

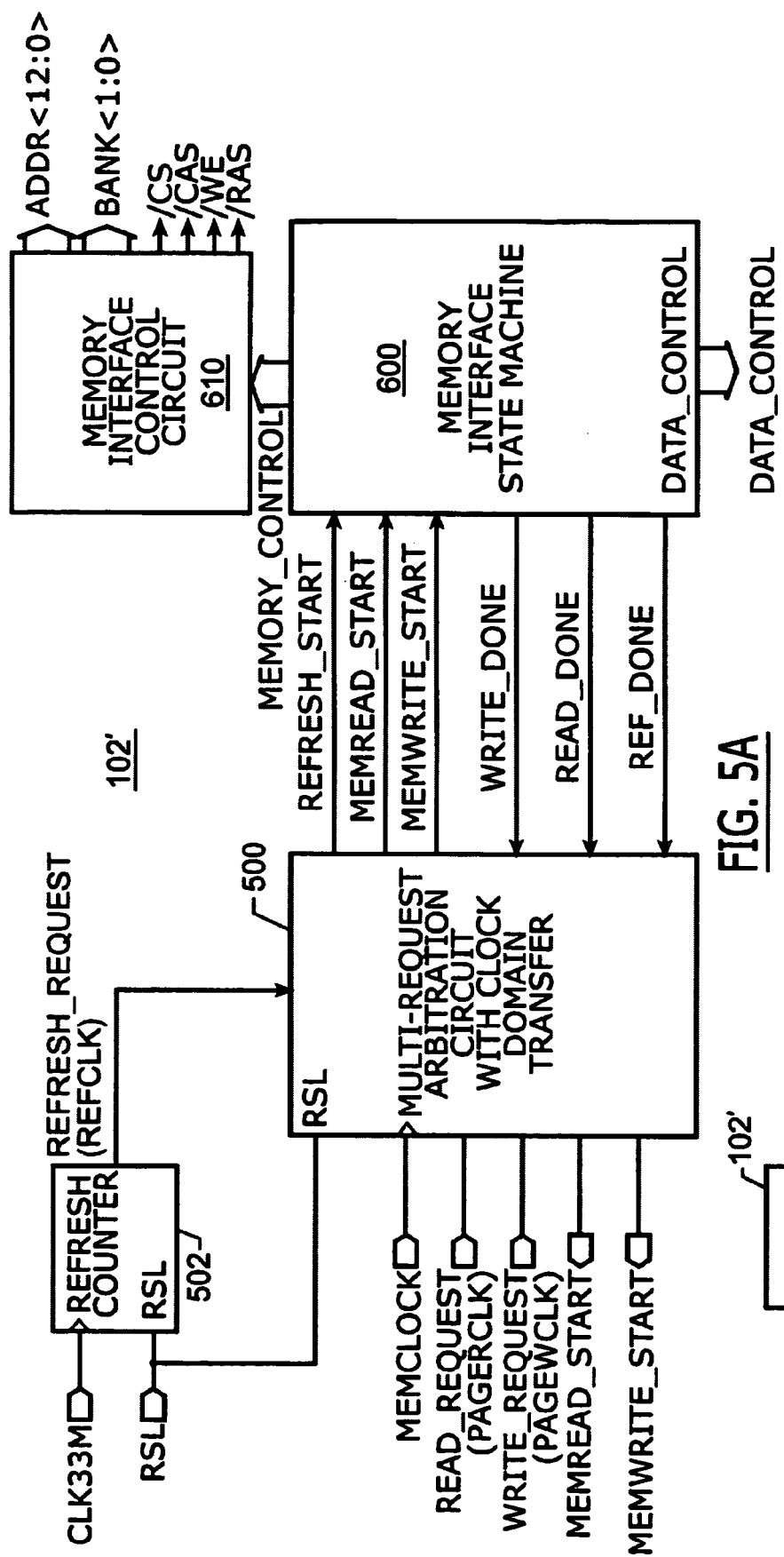

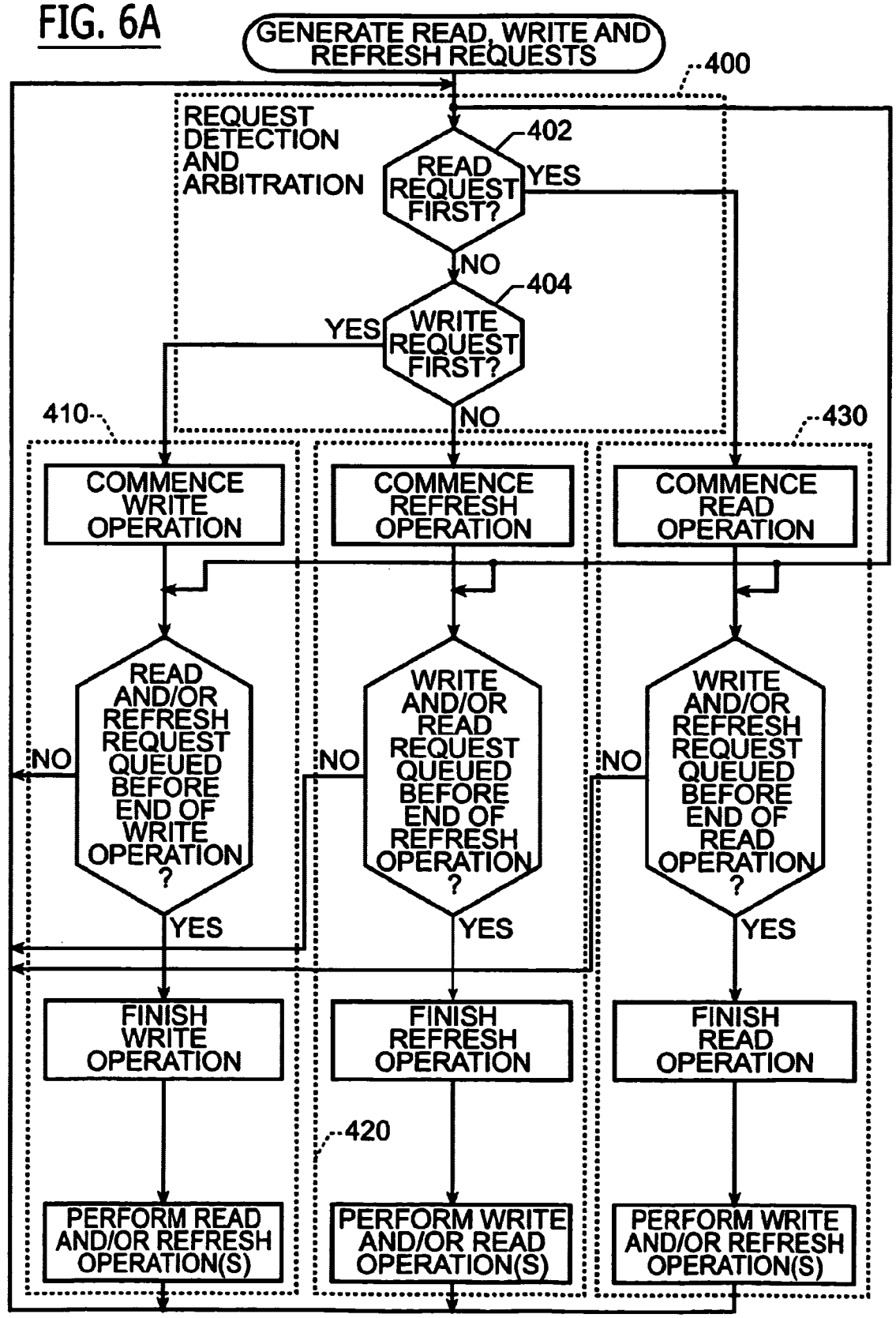

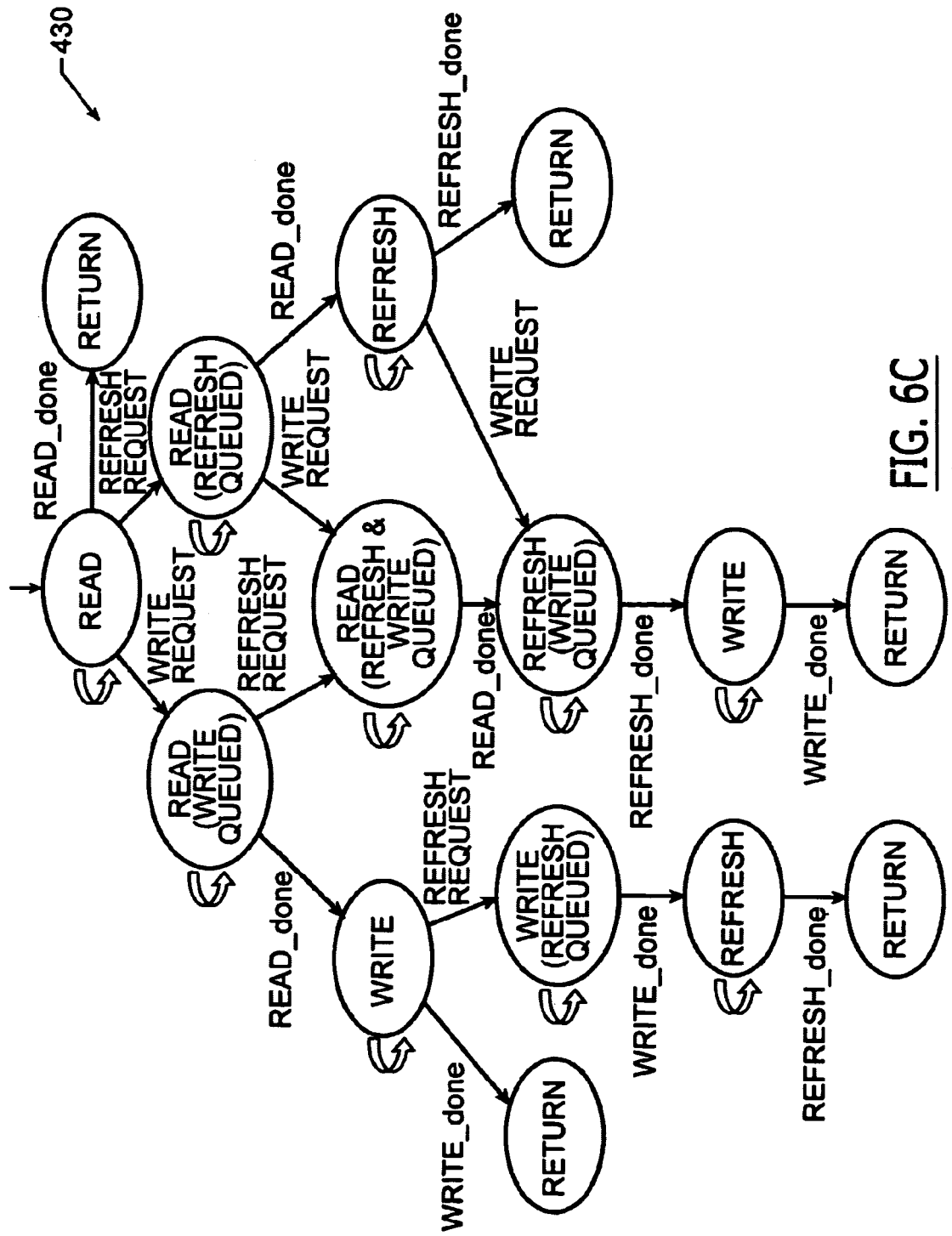

FIG. 9B_1

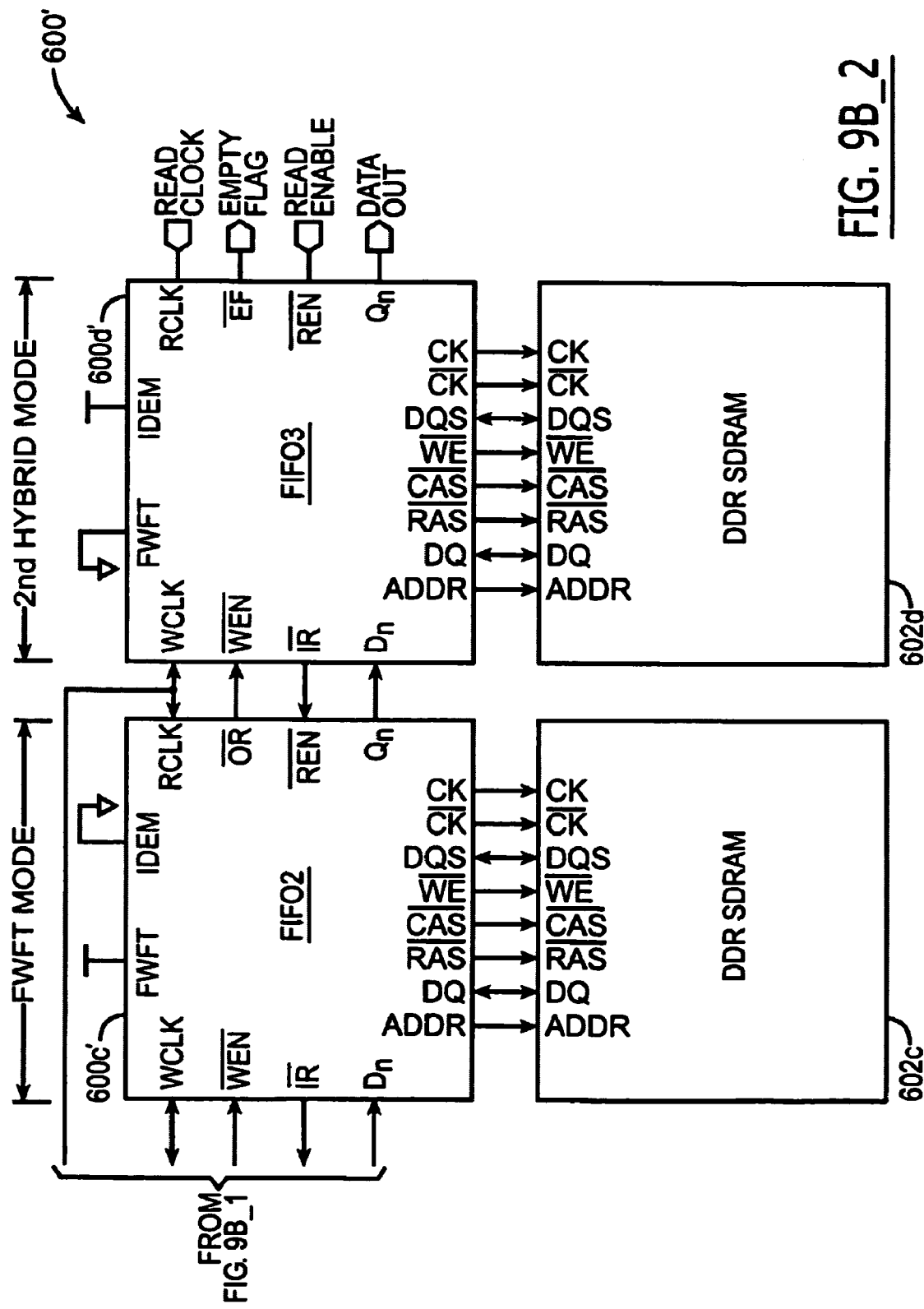
FIG. 9B_2

SEQUENTIAL FLOW-CONTROL AND FIFO MEMORY DEVICES THAT ARE DEPTH EXPANDABLE IN STANDARD MODE OPERATION

CROSS-REFERENCE TO RELATED APPLICATIONS

This application is a continuation-in-part (CIP) of U.S. application Ser. No. 10/612,849, filed Jul. 3, 2003, now U.S. Pat. No. 7,076,610, and claims the benefit of U.S. Provisional Application Ser. No. 60/520,356, filed Nov. 14, 2003, the disclosures of which are hereby incorporated herein by reference.

FIELD OF THE INVENTION

The present invention relates to integrated circuit memory devices and methods of operating same, and more particularly to buffer memory devices and methods of operating buffer memory devices.

BACKGROUND OF THE INVENTION

Semiconductor memory devices can typically be classified on the basis of memory functionality, data access patterns and the nature of the data storage mechanism. For example, distinctions are typically made between read-only memory (ROM) devices and read-Write memory (RWM) devices. The RWM devices typically have the advantage of offering both read and write functionality with comparable data access times. Typically, in RWM devices, data is stored either in flip-flops for "static" memory devices or as preset levels of charge on a capacitor in "dynamic" memory devices. As will be understood by those skilled in the art, static memory devices retain their data as long as a supply of power is maintained, however, dynamic memory devices require periodic data refreshing to compensate for potential charge leakage. Because RWM devices use active circuitry to store data, they belong to a class of memory devices known as "volatile" memory devices because data stored therein will be lost upon termination of the power supply. ROM devices, on the other hand, may encode data into circuit topology (e.g., by blowing fuses, removing diodes, etc.). Since this latter type of data storage may be hardwired, the data cannot be modified, but can only be read. ROM devices typically belong to a class of memory devices known as "nonvolatile" memory devices because data stored therein will typically not be lost upon termination of the power supply. Other types of memory devices that have been more recently developed are typically referred to as non-volatile read-write (NVRWM) memory devices. These types of memory devices include EPROM (erasable programmable read-only memory), E²PROM (electrically erasable programmable read-only memory), and flash memories, for example.

An additional memory classification is typically based on the order in which data can be accessed. Here, most memory devices belong to the random-access class, which means that memory locations can be read from or written to in random order, typically by supplying a read or write address. Notwithstanding the fact that most memory devices provide random-access, typically only random-access RWM memories use the acronym RAM. Alternatively, memory devices may restrict the order of data access to achieve shorter data access times, reduce layout area and/or provide specialized functionality. Examples of such specialized memory devices include buffer memory devices such as first-in first-out (FIFO) memory devices, last-in first-out (LIFO or "stack") memory devices, shift registers and content addressable memory (CAM) devices.

A final classification of semiconductor memories is based on the number of input and output ports associated with the memory cells therein. For example, although most memory devices have unit cells therein that provide only a single port which is shared to provide an input and output path for the transfer of data, memory devices with higher bandwidth requirements often have cells therein with multiple input and output ports. However, the addition of ports to individual memory cells typically increases the complexity and layout area requirements for these higher bandwidth memory devices.

Single-port memory devices are typically made using static RAM cells if fast data access times are requiring, and dynamic RAM cells if low cost is a primary requirement. Many FIFO memory devices use dual-port RAM-based designs with self-incrementing internal read and write pointers to achieve fast fall-through capability. As will be understood by those skilled in the art, fall-through capability is typically measured as the time elapsing between the end of a write cycle into a previously empty FIFO and the time an operation to read that data may begin. Exemplary FIFO memory devices are more fully described and illustrated at section 2.2.7 of a textbook by A. K. Sharma entitled "Semiconductor Memories: Technology, Testing and Reliability", IEEE Press (1997).

In particular, dual-port SRAM-based FIFOs typically utilize separate read and write pointers to advantageously allow read and write operations to occur independently of each other and achieve fast fall-through capability since data written into a dual-port SRAM FIFO can be immediately accessed for reading. Since these read and write operations may occur independently, independent read and write clocks having different frequencies may be provided to enable the FIFO to act as a buffer between peripheral devices operating at different rates. Unfortunately, a major disadvantage of typical dual-port SRAM-based FIFOs is the relatively large unit cell size for each dual-port SRAM cell therein. Thus, for a given semiconductor chip size, dual-port buffer memory devices typically provide less memory capacity relative to single-port buffer memory devices. For example, using a standard DRAM cell as a reference unit cell consuming one (1) unit of area, a single-port SRAM unit cell typically may consume four (4) units of area and a dual-port SRAM unit cell typically may consume sixteen (16) units of area. Moreover, the relatively large unit cells of a dual-port SRAM FIFO may limit the degree to which the number of write operations can exceed the number of read operations, that is, limit the capacity of the FIFO.

To address these limitations of dual-port buffer memory devices, single-port buffer memory devices have been developed to, among other things, achieve higher data capacities for a given semiconductor chip size. For example, U.S. Pat. No. 5,546,347 to Ko et al. entitled "Interleaving Architecture And Method For A High Density FIFO", assigned to the present assignee, discloses a memory device which has high capacity and uses relatively small single-port memory cells. However, the use of only single port memory cells typically precludes simultaneous read and write access to data in the same memory cell, which means that single-port buffer memory devices typically have slower fall-through time than comparable dual-port memory devices. Moreover, single-port buffer memory devices may use complicated arbitration hardware to control sequencing and queuing of reading and writing operations.

U.S. Pat. No. 5,371,708 to Kobayashi also discloses a FIFO memory device containing a single-port memory array, a read data register for holding read data from the memory array and a write data register for holding write data to the memory array. A bypass switch is provided for transferring data from the write data register to the read data register so that the memory array can be bypassed during testing of the FIFO to detect the presence of defects therein. However, like the above-described single-port buffer memory devices, simultaneous read and write access to data is not feasible.

Commonly assigned U.S. Pat. Nos. 5,978,307, 5,982,700 and 5,999,478 disclose memory buffers having fast fall-through capability. These memory buffers contain a tri-port memory array of moderate capacity having nonlinear columns of tri-port cells therein which collectively form four separate registers, and a substantially larger capacity supplemental memory array (e.g., DRAM array) having cells therein with reduced unit cell size. The tri-port memory array has a read port, a write port and a bidirectional input/output port. The tri-port memory array communicates internally with the supplemental memory array via the bidirectional input/output port and communicates with external devices (e.g., peripheral devices) via the read and write data ports. Efficient steering circuitry is also provided by a bidirectional crosspoint switch that electrically couples terminals (lines IO and IOB) of the bidirectional input/output port in parallel to bit lines (BL and BLB) in the supplemental memory array during a write-to-memory time interval and vice versa during a read-from-memory time interval. Commonly assigned U.S. Pat. No. 6,546,461 also discloses FIFO memory devices that use multiple multi-port caches to support high rate reading operations.

In order to increase the capacity of FIFO memory devices, multiple FIFO memory devices may be cascaded in a depth expansion configuration. As illustrated by FIG. 1A, a pair of FIFO memory devices may be configured to provide a higher capacity FIFO system 10. In this system 10, both devices operate in a conventional first-word fall-through (FWFT) mode. When disposed in the FWFT mode (pin FWFT=Vdd), the output ready pin (/OR) is used to indicate whether or not there is valid data at the data outputs (Qn) and the input ready pin (/IR) is used to indicate whether or not a FIFO memory device has any free space to support a writing operation. In the FWFT mode, the first word written to an empty FIFO memory device goes directly to the corresponding data outputs (Qn) after three rising edges of the read clock (RCLK) and any requirement that the read enable signal (/REN) be low to produce output data is not necessary.

The FIFO memory device on the left side of FIG. 1A has a write interface and a read interface. The write interface receives a write clock signal WCLK, a write enable signal (/WEN) and input data (Dn) and generates the input ready flag (/IR). The read interface receives a read clock signal RCLK and a read enable signal (/REN) and generates an output ready flag (/OR) and output data (Qn). This output ready flag (/OR) may be used as the write enable input signal (/WEN) to the next stage in the cascaded arrangement. The read interface of the left FIFO memory device is electrically coupled to a write interface of the FIFO memory device on the right side of FIG. 1A and the read and write clock signal pins at these interfaces receive a transfer clock (TRANSFER CLOCK). This transfer clock may be an independent clock signal or may constitute the write clock signal or read clock signal. A transfer clock signal operating a maximum frequency is preferred. However, if the write or read clock signal is used in place of the transfer clock signal, then the read or write clock signal having the higher frequency should be used. The read interface of the right FIFO memory device can be electrically coupled to a downstream peripheral device (not shown) or other device or system.

Unfortunately, the ability to increase the capacity of FIFO memory devices operating in the FWFT mode of operation does not translate to FIFO memory devices that are configured to operate in standard mode, which is another conventional mode of operation. This is because an empty flag (/EF) generated at an output of a FIFO memory device in standard mode may not be used as a write enable signal (/WEN) to the next stage in a cascaded arrangement. This is because there is a one cycle difference between the empty flag (/EF) and the output ready flag (/OR) when a FIFO memory device is disposed in the standard mode and FWFT mode, respectively. This one cycle difference in flag generation precludes reliable operation of a depth expansion arrangement of FIFO memory devices when they are disposed in the standard mode. Thus, as illustrated by FIG. 1B, a FIFO memory device 12 that is disposed in a conventional standard mode (pin FWFT=GND) cannot be arranged in a depth expansion configuration.

Thus, notwithstanding the above described FIFO memory devices, there continues to be a need for FIFO memory devices having enhanced features, including those that enable greater flexibility when designing systems requiring greater memory capacity.

SUMMARY OF THE INVENTION

Integrated circuit devices according to some embodiments of the present include a first-in first-out (FIFO) memory chip that is configured to support a pair of hybrid operating modes that enable the FIFO memory chip to be depth-expandable with other FIFO memory chips in a collective standard mode of operation. This pair of hybrid operating modes includes a first hybrid mode that supports a write interface configured in standard mode and a read interface configured in first-word fall-through (FWFT) mode. The second hybrid mode supports a write interface configured in FWFT mode and a read interface configured in standard mode. These first and second hybrid mode eliminate the need to use an empty flag (/EF) associated with a read interface of an upstream device as a write enable input (/WEN) to a FIFO chip in the next stage in a depth cascaded arrangement.

The first hybrid mode supports a write interface having a full flag pin (/FF) that designates when the FIFO memory chip is full and a read interface having an output ready pin (/OR) that designates when the FIFO memory chip has at least one entry therein. The second hybrid mode supports a write interface having an input ready pin (/IR) that designates when the FIFO memory chip can accept additional entries and a read interface having an empty flag pin (/EF) that designates when the FIFO memory chip is empty. The FIFO memory chip also has an input pin that is responsive to a standard depth expansion mode signal (IDEM). This pin operates with a FWFT pin to set one of four operating modes within the chip: full standard, full FWFT, first hybrid and second hybrid.

Integrated circuit memory devices according to other embodiments of the present invention include a quad-port cache memory device and a higher capacity supplemental memory device. These memory devices operate collectively as high speed buffer memory devices having fast fall through capability and extended data capacity. These devices do not require complex arbitration circuitry to oversee reading and writing operations. In come cases, the supplemental memory device may be an embedded on-chip memory device or a separate off-chip memory device.

The quad-port cache memory device may comprise a data input register having an input electrically coupled to a first port of the cache memory device and an output electrically coupled to a second port of the cache memory device. A multiplexer is also provided. This multiplexer is responsive to at least one select signal and has a first input electrically coupled to the output of the data input register and a second input electrically coupled to a third port of the cache memory device. The quad-port cache memory device also preferably includes an output register having an input electrically coupled to an output of the multiplexer and an output electrically coupled to a fourth port of the cache memory device. Retransmit capability may also be provided by including a retransmit register within the quad-port cache. This retransmit register has an input electrically coupled to the first port and an output electrically coupled to a third input of the multiplexer. The at least one select signal may include three (3) select signals. These select signals may be a retransmit path select signal, a memory path select signal and a direct path select signal. The data input register, the output register and the retransmit register may be responsive to write address, a read address and a retransmit address, respectively.

Other embodiments of the present invention include buffer memory devices that support bus matching and variable data bus widths. These memory devices include a memory array having a page of multi-port memory cells therein that spans at least X columns and Y rows. The page of memory cells is configured to support writing and reading of first data vectors to and from the X columns and writing and reading of second data vectors to and from the Y rows, where X and Y are unequal integers. In some of these embodiments, the first data vectors are Y-bit words and the second data vectors are X-bit words (e.g., Y=72 and X=36 in a page having 2592 (=72×36) multi-port memory cells) and the multi-port memory cells are quad-port memory cells. In other ones of these embodiments, the memory devices are first-in first-out (FIFO) memory devices.

Such FIFO memory devices may include a first cache memory device having a first page of quad-port memory cells therein. This first page is configured to support writing and reading of FIFO vectors to and from columns in the first page and writing and reading of memory vectors to and from rows in the first page, with each of the memory vectors including one bit of data from each of the FIFO vectors and vice versa. These memory vectors may have widths that are compatible with the bus widths associated with off-chip supplemental memory devices (e.g., DRAM, SRAM, etc.) that operate with the first cache memory device to provide a large capacity FIFO memory device. The FIFO memory device may also include a second cache memory device that is configured to operate in tandem with the first quad-port cache memory device so that FIFO write (and read) operations periodically switch back-and-forth between the first cache memory device and the second cache memory device. Error detection and correction circuitry may also be provided within the FIFO memory device. In particular, a check bit generation circuit may be provided that is configured to receive outgoing memory vectors from the first cache memory device. An error detection and correction circuit may be provided that is configured to provide incoming memory vectors to the first cache memory device. These incoming memory vectors are checked for errors (e.g., soft errors) and, if necessary, corrected.

BRIEF DESCRIPTION OF THE DRAWINGS

FIG. 2 is a block diagram of a FIFO memory device having a FIFO controller and off-chip supplemental memory device therein, according to embodiments of the present invention.

FIG. 4 is a block diagram of a page of quad-port memory cells that may be used in the quad-port cache illustrated by FIG. 2.

FIG. 6A is a flow diagram that illustrates request signal arbitration operations according to embodiments of the present invention.

FIG. 6C is a detailed flow diagram that illustrates a portion of the request signal arbitration operations of FIG. 6A.

DESCRIPTION OF PREFERRED EMBODIMENTS

Figure 1A:
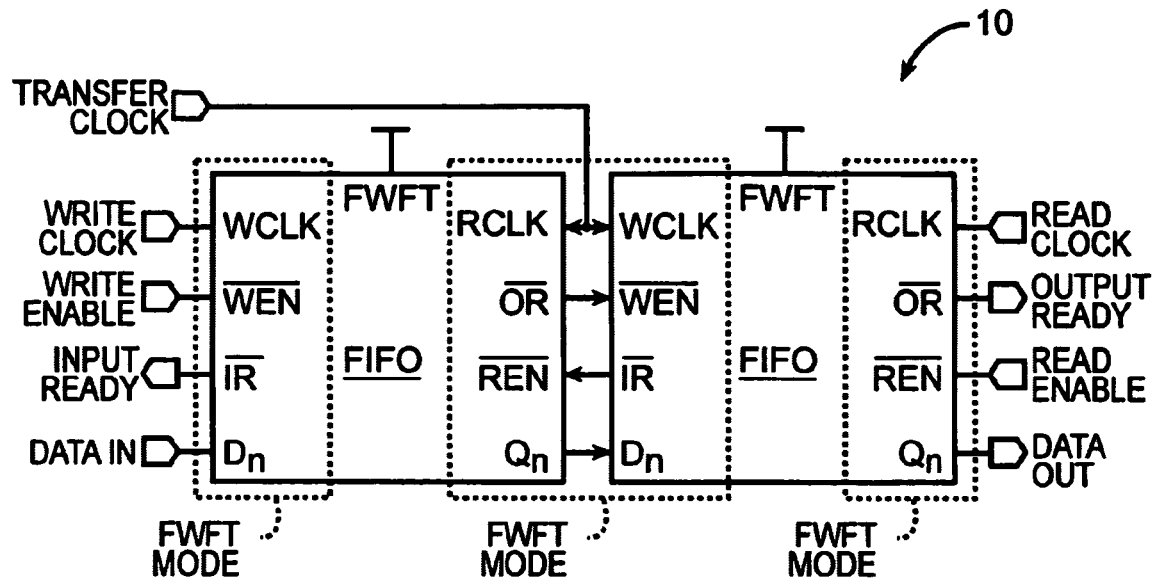
FIG. 1A illustrates a pair of conventional FIFO memory devices that are arranged in a depth expansion configuration and support conventional first-word fall-through (FWFT) mode operation.
Figure 1B:
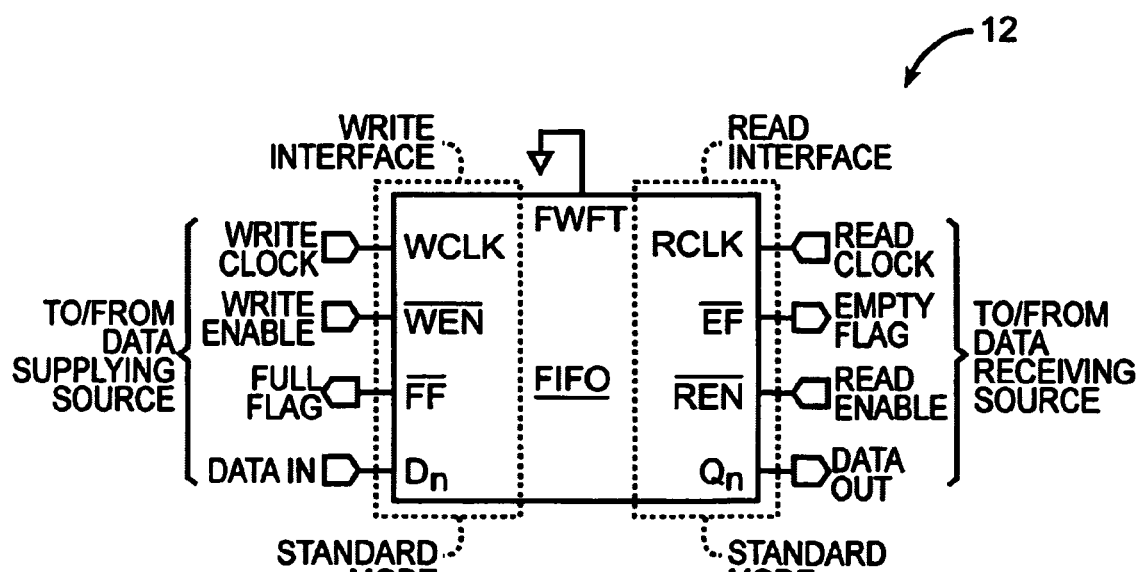
FIG. 1B illustrates a conventional FIFO memory device that is disposed in a conventional standard mode operation.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

A buffer memory device according to embodiments of the present invention may use a combination of integrated circuit memory devices that operate collectively as a FIFO memory device. One exemplary embodiment of a FIFO memory device 100 having a multi-chip configuration is illustrated by FIG. 2. This FIFO memory device 100 includes a FIFO controller 102, which may be formed on a first integrated circuit chip, and a supplemental memory device, which may be formed on a second integrated circuit chip. The supplemental memory device is illustrated as a dual data rate (DDR) memory device 140. In some embodiments of the present invention, the DDR memory device 140 may be a dynamic random access memory (DRAM) device or a static random access memory (SRAM) device. Memory devices that do not provide DDR operation may also be used as a supplemental memory device.

For purposes of discussion herein, the DDR memory device 140 will be treated as a DRAM memory device that requires periodic refreshing of entries therein. The FIFO controller 102 includes an input block 12', a quad-port cache control circuit 14' and an output block 16'. As illustrated, the input block 12' receives input data (DATA IN) having a first data width and provides a quad-port cache 130 within FIFO write data (DATA INPUT) having a second data width (shown as 144 bits/word). The first data width may vary depending on application. Each 144-bit write word may be formed as sixteen 9-bit words, eight 18-bit words, four 36-bit words, twelve 12-bit words, six 24-bit words or three 48-bit words. The output block 16' is also configured to map each 144-bit read word (DATA OUTPUT) into a corresponding plurality of output data words (DATA OUT). As explained more fully hereinbelow, the quad-port cache control circuit 14' performs various control operations, including operations to generate the DIRECTPATH and MEMPATH control signals. These control signals are provided to multiplexer circuitry within the quad-port cache 130.

The quad-port cache 130 is illustrated as including two pages (e.g., two arrays) of quad-port cache memory cells. These two pages are illustrated as QPCACHE0 132a and QPCACHE1 132b. Each page is illustrated as having 72 rows and 36 columns (i.e., 72×36). Based on this configuration, each 144-bit write word (DATA INPUT) that is received by the quad-port cache 130 may be written into either QPCACHE0 or QPCACHE1 as two consecutive ×72 FIFO vectors. Similarly, each 144-bit read word (DATA OUTPUT) that is received from the quad-port cache 130 may result from operations to read two adjacent ×72 FIFO vectors from either QPCACHE0 or QPCACHE1.

A data transfer control circuit 215 is electrically coupled between a bidirectional output port of the FIFO controller 102 and various ports of the quad-port cache 130. The bidirectional output port of the FIFO controller 102 is illustrated as including a bidirectional bus, which is capable of handling ×16, ×32 and ×36 data words that can be written to or read from the DDR memory device 140. Data words having a width of 64 bits (×64) may also be provided in the event the quad-port cache 130 is a 72×36×2×2 device. The data transfer control circuit 215 is configured to perform various error detection and correction operations. In particular, the data transfer control circuit 215 includes a first check bit generation circuit 210A and a second check bit generation circuit 210B. When enabled, the first check bit generation circuit 210A operates to generate a plurality of check bits for each word that is transferred from QPCACHE0 132a to the DDR memory device 140 during a cache-to-memory data transfer operation. Similarly, the second check bit generation circuit 210B operates to generate a plurality of check bits for each word that is transferred from QPCACHE1 132b to the DDR memory device 140 during a cache-to-memory data transfer operation. These check bits may support the detection and correction of one (or more) errors when the corresponding word is read back from the DDR memory device 140 during a memory-to-cache data transfer operation. In some cases, the FIFO controller 102 may have a mode of operation that does not include check bit generation during a cache-to-memory data transfer operation, or error detection and correction during a memory-to-cache data transfer operation. Accordingly, circuitry may be provided so that both the first check bit generation circuit 210A and the second check bit generation circuit 210B may be bypassed. Operations and circuitry for generating check bits for a given word length are well known to those skilled in the art and need not be further described herein.

The data transfer control circuit 215 further includes a first error detection and correction (EDC) circuit 220A, which provides verified data (without check bits) to QPCACHE0 132a, and a second error detection and correction circuit 220B, which provides verified data (without check bits) to QPCACHE1 132b. In some cases, the FIFO controller 102 may have a mode of operation that does not include error detection and correction. Thus, circuitry may be provided so that both the first error detection and correction circuit 220A and the second error detection and correction circuit 220B may be bypassed. Additional embodiments of the FIFO controller 102 may include the error detection and correction circuits 220A and 220B, but omit (or bypass) the check bit generation circuits 210A and 210B. These embodiments may be useful in those applications where the input data (DATA IN) received by the input block includes its own check bit information. In this case, the EDC circuits 220A and 220B may be configured to pass check bit information to the cache.

Figure 3A:
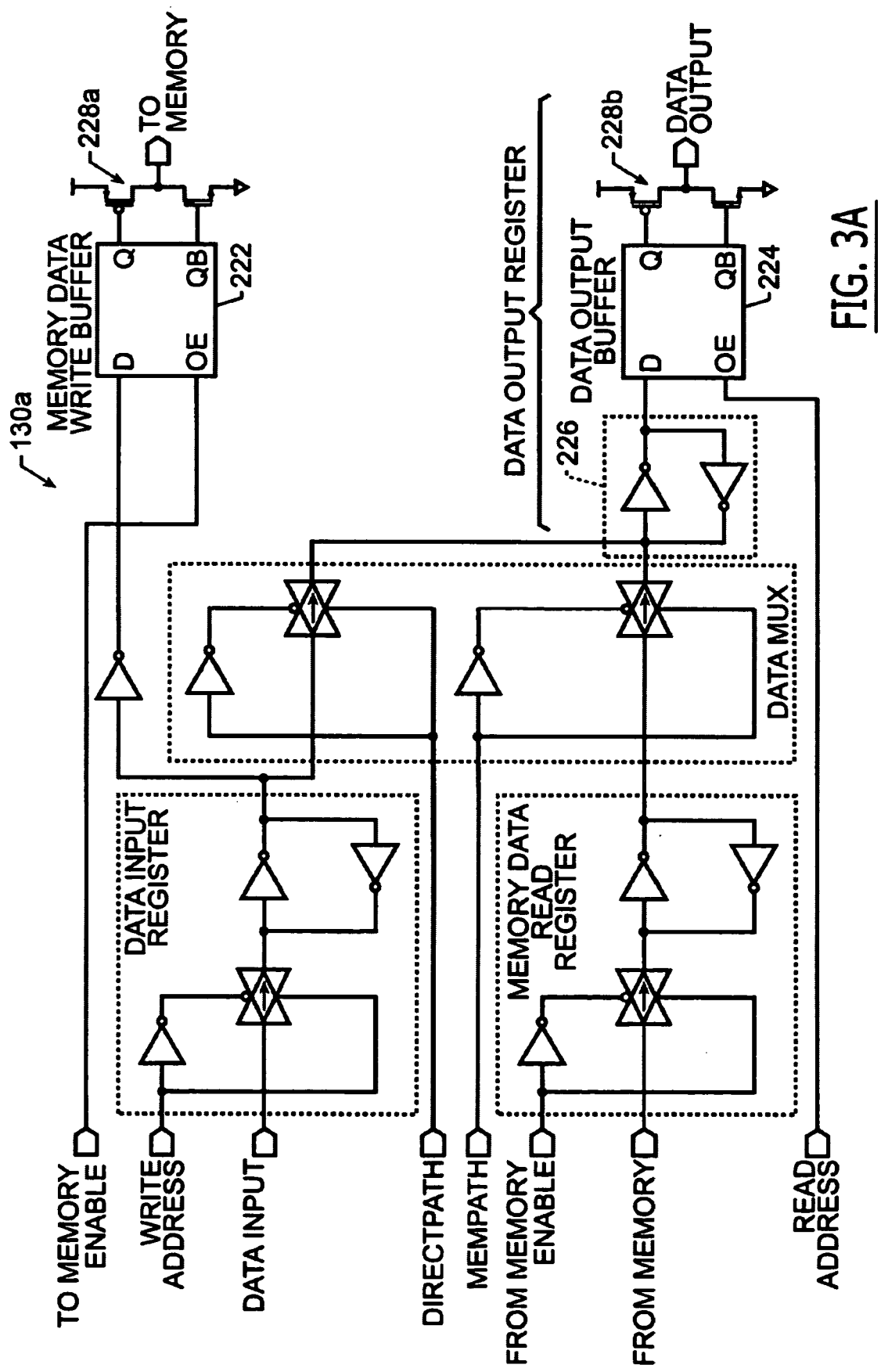
FIG. 3A is an electrical schematic of a quad-port memory cell that may be used in the FIFO controller illustrated by FIG. 2.

Each of the quad-port bit cells (QP-BC) within QPCACHE0 132a and QPCACHE1 132b may be configured as illustrated by the bit cell 130a of FIG. 3A. The quad-port bit cell 130a has four ports, which include two unidirectional input ports and two unidirectional output ports. The input ports include a "data input" port (DATA INPUT), which receives FIFO write data from the input block 12', and a "from memory" port (FROM MEMORY), which receives "next-to-read" data that is being transferred from the DDR memory device 140 to the quad-port cache 130 during a memory-to-cache data transfer operation. This next-to-read data may be error checked and corrected by the error detection and correction circuits 220A or 220B. Alternatively, the incoming next-to-read data may bypass the error detection and correction circuits 220A and 220B. The two output ports include a "to memory" port (TO MEMORY), which is active when a page of recently written data is being transferred from the quad-port cache 130 to the DDR memory device 140 during a cache-to-memory data transfer operation, and a "data output" port (DATA OUTPUT), which is configured to transfer FIFO read data from either QPCACHE0 132a or QPCACHE1 132b to the output block 16'.

A data input register and memory data read register are provided to store the FIFO write data and the "next-to-read" data received from the DDR memory device 140, respectively. The data input register is illustrated as including a transmission gate, which is responsive to a write address, and a latch. Similarly, the memory data read register is illustrated as including a transmission gate, which is responsive to an enable signal (shown as FROM MEMORY ENABLE) and a latch. A 2-input data multiplexer (DATA MUX) is also provided. The data multiplexer can be configured so that the FIFO write data is directly passed (as FIFO read data) to the data output port (DATA OUTPUT), to thereby support fast fall through capability. This configuration is achieved by setting the direct path signal (DIRECTPATH) to an active high level. Alternatively, the 2-input data multiplexer can be configured so that data retrieved from the DDR memory device 140 is available for reading at the data output port. This latter configuration is achieved by setting the memory path signal (MEMPATH) to an active high level. The output of the data multiplexer is connected to an inverting latch 226. An output of the latch 226 is electrically coupled to an input of a data output buffer 224, which is responsive to a read address (READ ADDRESS). The data output register 224 has a pair of complementary outputs (shown as Q and QB) that are provided to a driver device 228b.

A memory write path is also provided within the quad-port bit cell 130a. This memory write path extends from an output of the data input register to an input of a memory data write buffer 222. The memory write path also includes an inverter and a driver device 228a, which is connected to complementary outputs of the memory data write buffer 222. The memory data write buffer 222 is responsive to a memory enable signal (TO MEMORY ENABLE). When the memory enable signal is set to an active high level, FIFO write data is passed from the data input register to the "to memory" port (TO MEMORY). Thus, regardless of how the data multiplexer (DATA MUX) is set, the receipt of an active memory enable signal will enable transfer of FIFO write data from the quad-port cache 130 to the DDR memory device 140.

Figure 3B:
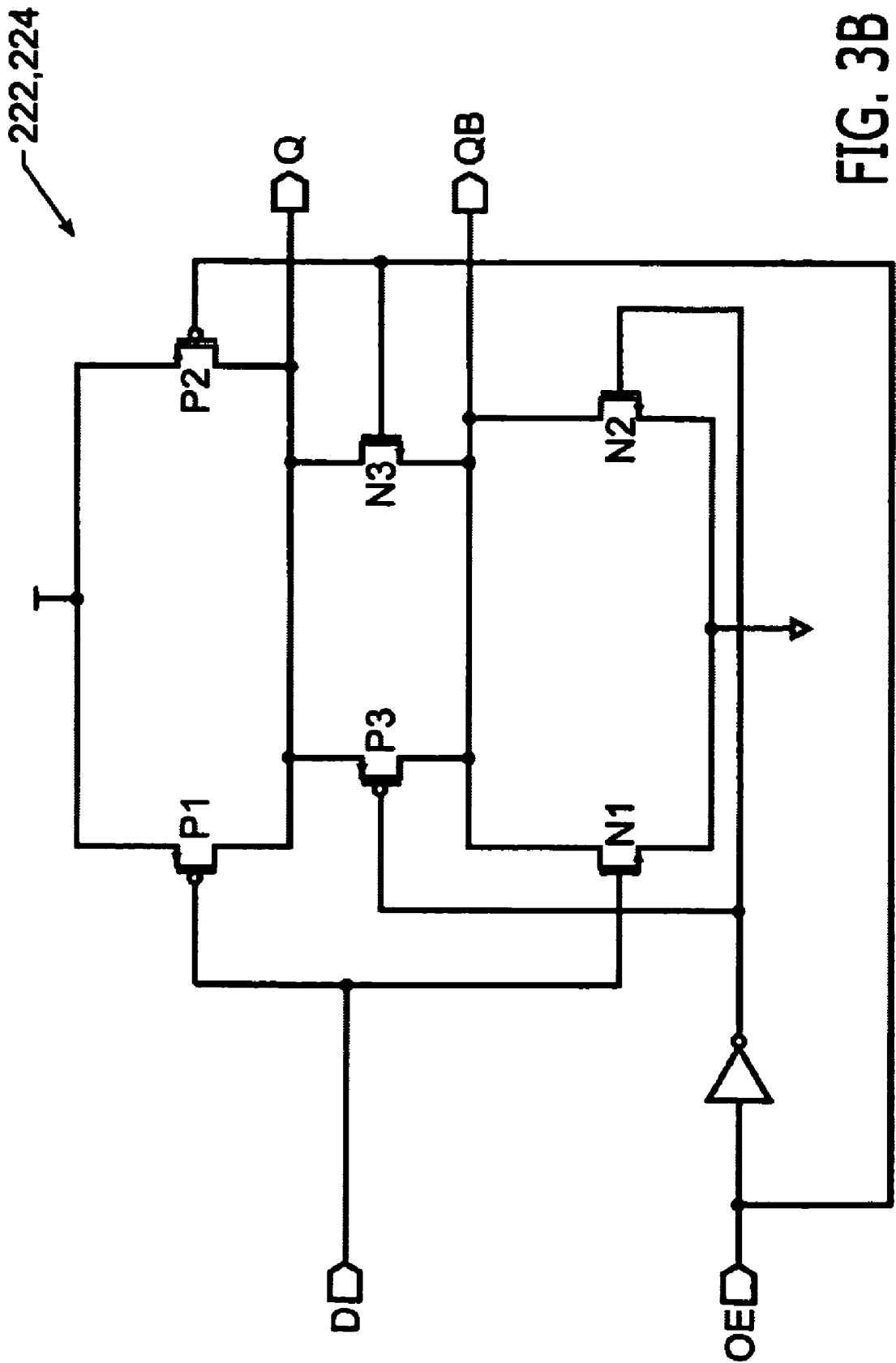
FIG. 3B is an electrical schematic of an embodiment of a buffer, which may be used as illustrated by FIG. 3A.

FIG. 3B is an electrical schematic of a register that may be used as the memory data write buffer 222 and the data output buffer 224. The register is illustrated as including PMOS transistors P1–P3 and NMOS transistors N1–N3. When an input signal (D) is set to a high level, NMOS transistor N1 is turned on and the complementary output QB is pulled (or held) low. If the output enable signal OE is set high to an active level, then NMOS transistor N3 and PMOS transistor P3 will both be turned on and the true output Q will be pulled low by NMOS transistor N1. When this occurs, both the true and complementary outputs Q and QB will be set low and the output of the driver device 228b will be pulled high to reflect the high level of the input signal D. However, if the input signal D is set to a low level when the output enable signal OE is set high, then PMOS transistor P1 will be turned on and the true output will be pulled high. The complementary output QB will also be pulled high by NMOS transistor N3 and PMOS transistor P3. This will cause the output of the driver device 228b to be pulled low. Finally, when the output enable signal OE is set low, the true output Q will be pulled high and the complementary output QB will be pulled low and the output of the driver device 228b will be disposed in a high impedance state.

FIG. 4 illustrates an arrangement of quad-port bit cells (QP_BC) within a page of the quad-port cache 130. Thus, as illustrated, QPCACHE0 132a and QPCACHE1 132b may each contain a total of 2592 bit cells that span 72 rows and 36 columns. Each of the 36 columns of bit cells is configured to retain a respective FIFO vector having a data width equal to 72 bits. Each of the 72 rows of bit cells is configured to retain a respective memory vector having a maximum data width equal to 36 bits. The data input port (DATA INPUT) and the data output port (DATA OUTPUT) illustrated in the bit cell 130a of FIG. 3A correspond to the FIFO data input port (FIFO DATA INPUT (×144)) and FIFO data output port (FIFO DATA OUTPUT (×144)) illustrated in FIG. 4. Accordingly, each FIFO write word (having 144 bits) can be written into two adjacent columns within the illustrated page of quad-port cells and each FIFO read word can be read from two adjacent columns. This means that a maximum of 18 FIFO write words (144 bits/word) can be written into an empty page before it becomes full. This maximum value of 18 FIFO write words is reduced to 16 FIFO write words in the event the DDR memory device 140 is configured to accept 32-bit words instead of 36-bit words. These 16 FIFO write words may be treated as filling the 32 leftmost columns in the illustrated page, whereas 18 FIFO write words may be treated as filling all 36 columns of the illustrated page.

The "to memory" port (TO MEMORY) and the "from memory" port (FROM MEMORY) illustrated in the bit cell 130a of FIG. 3A correspond to the "to memory" port (TO MEMORY (×64, ×72)) and the "from memory" port (FROM MEMORY (×64, ×72)) illustrated at the top FIG. 4. Accordingly, in the event the DDR memory device 140 accepts 32-bit words, then a maximum of 72 32-bit memory vectors (corresponding to 36 64-bit words) can be transferred out of the page during a cache-to-memory data transfer operation. This cache-to-memory data transfer operation may include passing the page of data through one of the check bit generation circuits (CB GEN) illustrated by FIG. 2. Alternatively, if the DDR memory device 140 accepts 36-bit words, then a maximum of 72 36-bit memory vectors (corresponding to 36 72-bit words) can be transferred out of the page during a cache-to-memory data transfer operation. The same relationships apply to the filling of a page of quad-port bit cells during memory-to-cache data transfer operations (i.e., when a page is being loaded with next-to-read data from the DDR memory device 140). This memory-to-cache data transfer operation may include passing the page of data through one of the error detection and correction circuits (EDC) illustrated by FIG. 2.

By configuring the page of cache according to the layout of FIG. 4, efficient bus matching characteristics may be achieved using data rotation operations (horizontal-to-vertical and vertical-to-horizontal). For example, the illustrated page enables 32 or 36×72 FIFO vectors to be written into and read from columns of the page during FIFO write and read operations, respectively. Moreover, the page enables 72×32 or ×36 (or other widths) memory vectors to be read from or written to rows of the page during cache-to-memory and memory-to-cache data transfer operations, respectively. These operations represent vertical transfer operations. Because of the data rotation operations, each of the memory vectors will retain one bit of data from a corresponding ×72 FIFO vector. Accordingly, each filled row of memory cells within the DDR memory device 140 may retain a memory vector that contains one bit of data from 32 or 36 distinct FIFO vectors.

The cache-to-memory and memory-to-cache data transfer operations require the DDR memory device 140 to undergo write and read operations, respectively. The timing of these operations is controlled by the FIFO controller 102. Moreover, in the event the DDR memory device 140 is a DRAM device, the FIFO controller 102 may also be required to control the timing of periodic refresh operations within the DRAM device. The timing of these operations: DDR read, DDR write and DDR refresh, may occur in any sequence and may repeatedly change sequence and frequency throughout operation. For example, if the FIFO memory device 100 is undergoing many write operations but very few read operations during a particular time interval, then the DDR memory device 140 will undergo many consecutive write and refresh operations that are interleaved, but very few read operations. Alternatively, if the FIFO memory device 100 is undergoing many read operations but very few write operations during a particular time interval, then the DDR memory device 140 will undergo many consecutive read and refresh operations, but very few write operations. Moreover, whereas the frequency of the refresh operations may be a dictated by particular requirements of the DDR memory device 140, the frequency, timing and order of the write and read operations will be influenced by the frequency at which the FIFO memory device 100 is accessed by external devices (not shown). This precludes the FIFO controller 102 from controlling all aspects of the read and write request signal generation.

Figure 6B:
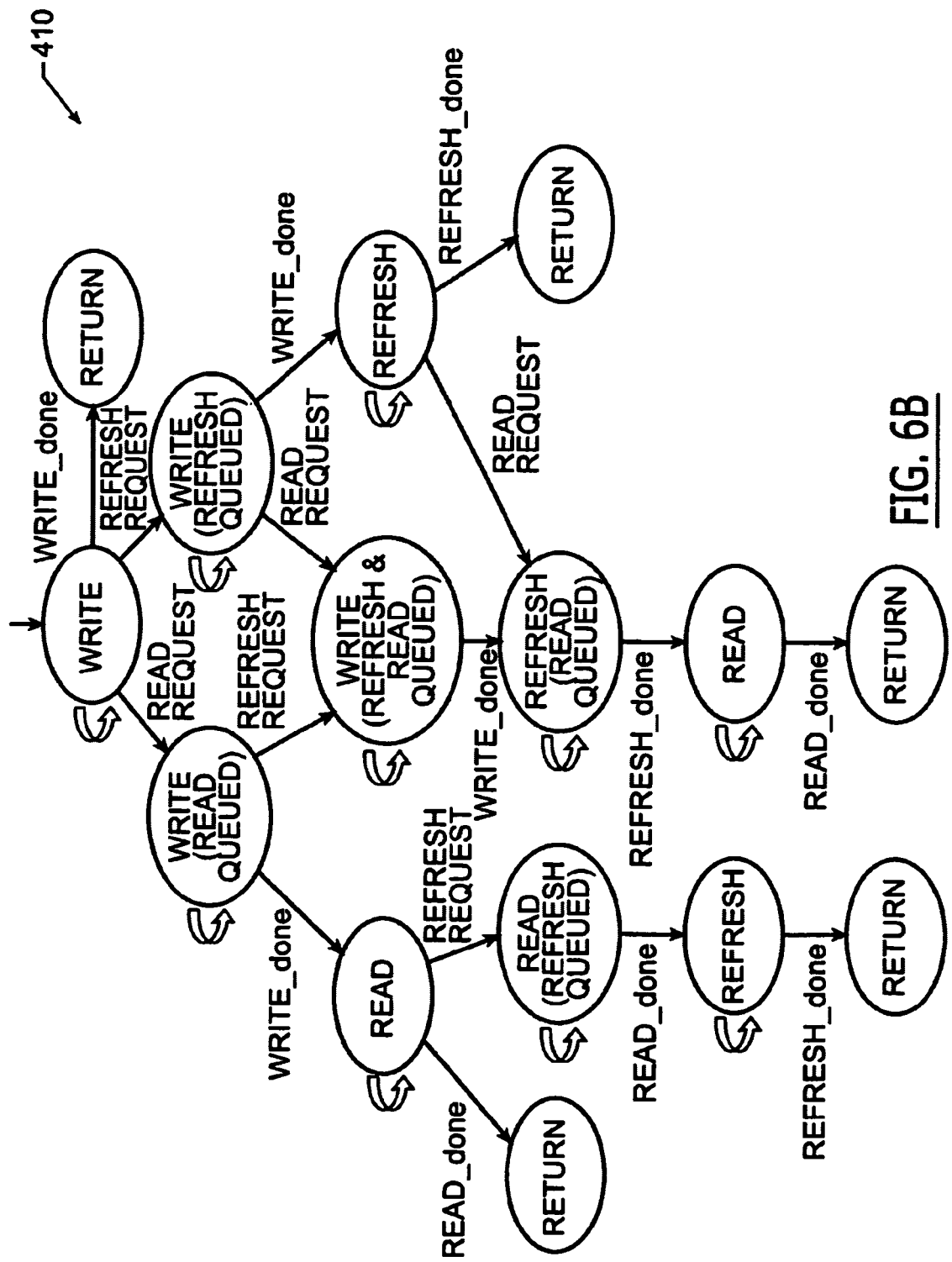
FIG. 6B is a detailed flow diagram that illustrates a portion of the request signal arbitration operations of FIG. 6A.

FIGS. 6A–6D and 7A–7H illustrate operations to arbitrate the timing of when read, write and refresh commands are issued to the DDR memory device 140, in response to the asynchronous generation of read, write and refresh requests within the FIFO controller 102. In FIG. 6A, request detection and arbitration operations 400 are performed in response to any order or timing of read, write and refresh requests. As illustrated by Blocks 402 and 404, checks are initially made to arbitrate between read, write and refresh requests in order to detect which request came first in time. If a read request was generated first, then operations associated with Block 430 are performed. However, if a write request was generated first, then operations associated with Block 410 are performed. Finally, if a refresh request was generated first, then operations associated with Block 420 are performed.

As illustrated by Block 410 in FIG. 6A, if a write request is detected as a first request, then a write command is issued to the DDR memory device 140 and write operations are commenced. These write operations represent a portion of the cache-to-memory data transfer operations. Following detection of the write request, a continuous check is made to determine whether any other requests (read or refresh) are made prior to completion of the write operations. If no other requests are made prior to completion, then control is passed to the request detection and arbitration operations, Block 400. However, if another request is made, then operations associated with the additional request(s) are performed after completion of the write operation. The operations performed by Block 410 are more fully illustrated by FIG. 6B.

As illustrated by Block 430 in FIG. 6A, if a read request is detected as a first request, then a read command is issued to the DDR memory device 140 and read operations are commenced. These read operations represent a portion of the memory-to-cache data transfer operations. Following detection of the read request, a continuous check is made to determine whether any other requests (write or refresh) are made prior to completion of the read operations. If no other requests are made prior to completion, then control is passed to the request detection and arbitration operations, Block 400. However, if another request is made, then operations associated with the additional request(s) are performed after completion of the read operation. The operations performed by Block 430 are more fully illustrated by FIG. 6C.

As illustrated by Block 420 in FIG. 6A, if a refresh request is detected as a first request, then a refresh command is issued to the DDR memory device 140 and refresh operations are commenced within the DDR memory device 140. Following detection of the refresh request, a continuous check is made to determine whether any other requests (write or read) are made prior to completion of the refresh operations. If no other requests are made prior to completion, then control is passed to the request detection and arbitration operations, Block 400. However, if another request is made, then operations associated with the additional request(s) are performed after completion of the refresh operation. The operations performed by Block 420 are more fully illustrated by FIG. 6D.

FIG. 6B is a flow diagram that illustrates detection of a write request as a first request followed by various read and refresh request timing combinations. In response to detection of a write request as a first request, a write command is issued by the FIFO controller 102 and write operations are performed as part of a cache-to-memory data transfer. If the write operations are completed before either a read or refresh request is detected, then control is returned to Block 400. This sequence is illustrated at the top of FIG. 6B, where write operations are performed and then a WRITE_done signal is generated to signify completion of the write operations.

Referring now to the left side of FIG. 6B, a read request may be received prior to completion of the write operations. If this occurs, then the read request is queued while further write operations are performed. If the write operations are completed prior to receipt of any refresh request, then read operations will be commenced. If the read operations are completed prior to receipt of any refresh request, then a READ_done signal is generated to signify completion of the read operations and then control is returned to Block 400. However, if a refresh request is received prior to completion of the read operations, then the refresh request will become queued until such time as the read operations are completed. Once the read operations have been completed and the READ_done signal has been issued, the refresh operations will be performed. Upon completion of the refresh operations, a REFRESH_done signal is generated and control is returned to Block 400.

On the other hand, if a read request is received during write operations and then followed by a refresh request prior to completion of the write operations, the refresh and read requests will both be queued and the queued refresh request will have higher queue priority. Thus, upon completion of the write operations, refresh operations will be commenced while the earlier received read request remains queued because it has lower queue priority. This lower queue priority of the read request (and any write request) relative to a queued refresh request enables the refresh operations to be performed as soon as possible after a refresh request has been made. This insures that any requested refresh operation is performed in a timely manner so that data is not lost within the DDR memory device 140 for failure to timely refresh. The generation of a REFRESH_done signal signifies completion of the refresh operations and prompts commencement of operations responsive to the remaining queued read request.

Referring now to the right side of FIG. 6B, a refresh request may be received prior to completion of the write operations. If this occurs, then the refresh request is queued while further write operations are performed. If the write operations are completed prior to receipt of any read request, then refresh operations will be commenced. If the refresh operations are completed prior to receipt of any read request, then a REFRESH_done signal is generated to signify completion of the refresh operations and control is returned to Block 400. On the other hand, if a refresh request is received and then followed by a read request prior to completion of the write operations, the refresh and read requests will both be queued and the queued read request will have lower queue priority. Thus, upon completion of the write operations, refresh operations will be commenced while the later received read request remains queued. Once the refresh operations have been performed and a REFRESH_done signal is generated, then the read operations will be performed in response to the queued read request. Control is returned to Block 400 upon generation of the READ_done signal.

FIG. 6C is a flow diagram that illustrates detection of a read request as a first request followed by various write and refresh request timing combinations. In response to detection of a read request as a first request, a read command is issued by the FIFO controller 102 and read operations are performed as part of a memory-to-cache data transfer. If the read operations are completed before either a write or refresh request is detected, then control is returned to Block 400. This sequence is illustrated at the top of FIG. 6C, where read operations are performed and then a READ_done signal is generated to signify completion of the read operations.

Referring now to the left side of FIG. 6C, a write request may be received prior to completion of the read operations. If this occurs, then the write request is queued while further read operations are performed. If the read operations are completed prior to receipt of any refresh request, then write operations will be commenced upon completion of the read operations. If the write operations are completed prior to receipt of any refresh request, then a WRITE_done signal is generated to signify completion of the write operations and then control is returned to Block 400. However, if a refresh request is received prior to completion of the write operations, then the refresh request will become queued until such time as the write operations are completed. Once the write operations have been completed and the WRITE_done signal has been issued, the refresh operations will be performed. Upon completion of the refresh operations, a REFRESH_done signal is generated and control is returned to Block 400.

On the other hand, if a write request is received during read operations and then followed by a refresh request prior to completion of the read operations, the refresh and write requests will both be queued and the queued refresh request will have higher queue priority. Thus, upon completion of the read operations, refresh operations will be commenced while the earlier received write request remains queued because it has lower queue priority. The generation of a REFRESH_done signal signifies completion of the refresh operations and prompts commencement of operations responsive to the remaining queued write request.

Referring now to the right side of FIG. 6C, a refresh request may be received prior to completion of the read operations. If this occurs, then the refresh request is queued while further read operations are performed. If the read operations are completed prior to receipt of any write request, then refresh operations will be commenced. If the refresh operations are completed prior to receipt of any write request, then a REFRESH_done signal is generated to signify completion of the refresh operations and control is returned to Block 400. On the other hand, if a refresh request is received and then followed by a write request prior to completion of the read operations, the refresh and write requests will both be queued and the queued write request will have lower queue priority. Thus, upon completion of the read operations, refresh operations will be commenced while the later received write request remains queued. Once the refresh operations have been performed and a REFRESH_done signal is generated, then the write operations will be performed in response to the queued write request. Control is returned to Block 400 upon generation of the WRITE_done signal.

Figure 6D:
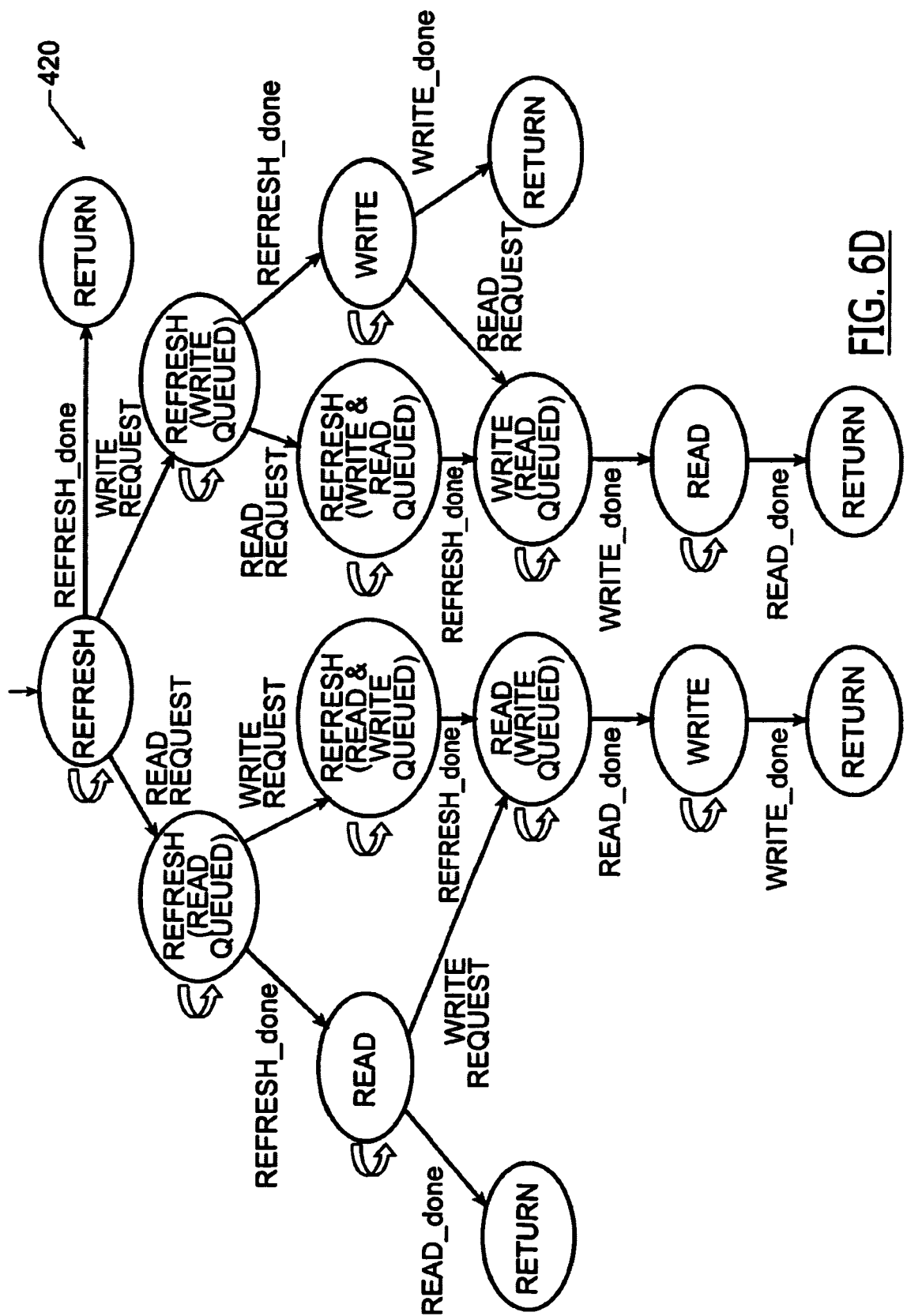
FIG. 6D is a detailed flow diagram that illustrates a portion of the request signal arbitration operations of FIG. 6A.

FIG. 6D is a flow diagram that illustrates detection of a refresh request as a first request followed by various write and read request timing combinations. Because the read and write requests have equivalent queue priorities, the right side of FIG. 6D, which follows a write request being received after the refresh request, is similar to the left side of FIG. 6D, which follows a read request being received after the refresh request. In the flow diagram of FIG. 6D, the read and write requests are queued so that operations associated with the earlier of the two received requests is performed before operations associated with the later received request are performed.

Thus, in FIG. 6D, if a REFRESH_done signal is generated prior to receipt of any read or write request, then control is returned to Block 400 upon completion of the refresh operations. However, if only a write request is received prior to completion of the refresh operations, then the write request is queued and write operations are performed upon completion of the refresh operations (i.e., when the REFRESH_done signal is generated). If no read request is received while the write operations are being performed, then control will be passed to Block 400 upon completion of the write operations, as illustrated by the right side of FIG. 6D. But, if a read request is received prior to completion of the write operations, then read operations will be performed in response to generation of the WRITE_done signal. Finally, if a write request and then a read request are queued prior to completion of the refresh operations, then the write operations will be performed in response to generation of the REFRESH_done signal and read operations will be performed in response to generation of the WRITE_done signal.

In contrast, if only a read request is received prior to completion of the refresh operations, then the read request is queued and read operations are performed upon completion of the refresh operations (i.e., when the REFRESH_done signal is generated). If no write request is received while the read operations are being performed, then control will be passed to Block 400 upon completion of the read operations, as illustrated by the left side of FIG. 6D. But, if a write request is received prior to completion of the read operations, then write operations will be performed in response to generation of the READ_done signal. Finally, if a read request and then a write request are queued prior to completion of the refresh operations, then the read operations will be performed in response to generation of the REFRESH-_done signal and write operations will be performed in response to generation of the READ_done signal.

The read operations from the DDR memory device 140 represent a subset of the memory-to-cache data transfer operations and the memory-to-cache data transfer operations represent a subset of the operations to read FIFO vectors from the quad-port cache 130. During the memory-to-cache data transfer operations, pages of read data from the DDR memory device 140 are routed through the error detection and correction (EDC) circuits 220A and 220B in an alternating sequence that is 180 degrees out-of-phase relative to the operations to read FIFO vectors from QPCACHE0 132a and QPCACHE1 132b, which are also performed in an alternating back-and-forth sequence between the pages of cache. This out-of-phase relationship enables the latency associated with passing read data through the first EDC circuit 220A or the second EDC circuit 220B to be hidden entirely from the operations to read FIFO vectors from the quad-port cache 130. For example, when reading FIFO vectors from QPCACHE0 132a, the memory vectors within QPCACHE1 132b are being filled with next-to-read data that has been error checked. Similarly, when reading FIFO vectors from QPCACHE1 132b, the memory vectors within QPCACHE0 132a are being filled with next-to-read data that has been error checked. Thus, any EDC latency associated with filling memory vectors in one page of cache during a memory-to-cache data transfer operation is hidden from operations to read FIFO vectors from another page of cache.

The arbitration operations illustrated by the flow diagrams of FIGS. 6A–6D are further illustrated by the timing diagrams of FIGS. 7A–7H. These timing diagrams illustrate timing of the following signals: PAGEWCLK, PAGERCLK, REFCLK, MEMCLK, MEMWRITE_START, MEMREAD_START, REFRESH_START, WRITE_DONE, READ_DONE and REF_DONE. The signals PAGEWCLK, PAGERCLK and REFCLK are generated as active high pulses to indicate a write request, a read request and a refresh request. The signal MEMCLK is a periodic clock signal, which is illustrated as having a frequency equal to 166.67 MHz. The request signals are asynchronously timed relative to each other. For example, the timing of a write request is a function of the frequency and number of FIFO write operations being performed on the quad-port cache 130 and the timing of a read request is a function of the frequency and number of FIFO read operations being performed on the quad-port cache 130. As will be understood by those skilled in the art, the timing of the FIFO write operations and the timing of FIFO read operations are controlled by separate external devices (not shown) that are frequently not synchronized with each other. Moreover, the refresh request signal REFCLK is generated periodically in response to the counting of a clock signal that is independent of the FIFO write operations and FIFO read operations. Accordingly, the timing of the write, read and refresh requests can occur in any order with and without timing overlap, as illustrated by FIGS. 7A–7H.

The signals MEMWRITE_START, MEMREAD_START and REFRESH_START are generated by a multi-request arbitration control circuit. These signals, which are generated as active high pulses, are made active during nonoverlapping time intervals. While active, these "start" signals signify the commencement and continuation of operations relating to cache-to-memory data transfer operations (MEMWRITE_START), memory-to-cache data transfer operations (MEMREAD_START) and refresh operations (REFRESH_START). These "start" signals are synchronized with MEMCLK. Finally, the signals WRITE_DONE, READ_DONE and REF_DONE are active low signals that are received by the multi-request arbitration control circuit when a respective write, read or refresh operation has been completed.

Figures 7A, 7B:
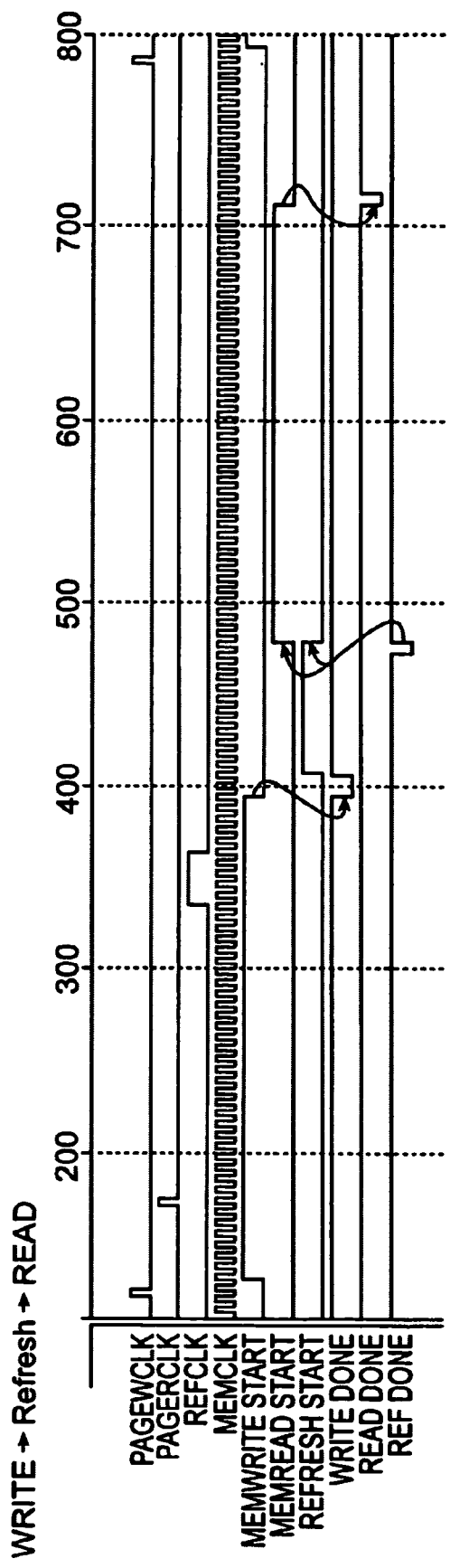
FIGS. 7A–7H are timing diagrams that illustrate the timing of request signal arbitration operations according to embodiments of the present invention.

In FIG. 7A, the illustrated sequence of requests includes a write request, a read request and then a refresh request (i.e., a write-then-read-then-refresh sequence). These requests are spaced apart in time and may suggest a write, read and refresh sequence of operations within the DDR memory device 140. However, because the refresh request, which is an active high REFCLK pulse, occurs prior to completion of the write operation (i.e., while MEMWRITE_START is active at a high level), the refresh request becomes queued at a higher priority relative to the previously queued read request. Accordingly, as illustrated by FIGS. 7A and 6B, the refresh operations are commenced upon completion of the write operations and then the read operations are commenced upon completion of the refresh operations.

In FIGS. 7B and 6B, the illustrated sequence of requests includes a write request, a refresh request and then a read request (i.e., a write-then-refresh-then-read sequence). This sequence results in the performance of write operations, then refresh operations and then read operations. In this case, the order in which the requests are queued is also the order in which operations associated with the requests are performed. In other words, no requests are taken out of order because of a higher queue priority.

Figures 7C, 7D:
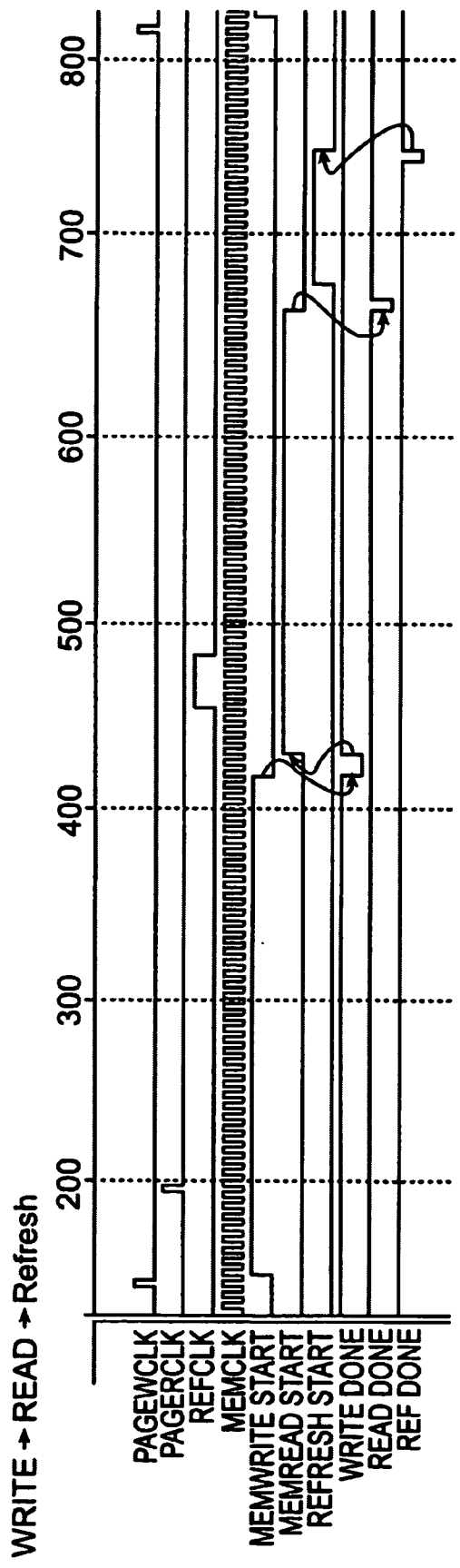

In FIGS. 7C and 6B, the illustrated sequence of requests includes a write request, a read request and then a refresh request (i.e., a write-then-read-then-refresh sequence). However, the refresh request occurs after the write operations have been performed. Accordingly, the previously queued read request is used to commence read operations upon completion of the write operations and the refresh request is queued during these read operations.

In FIGS. 7D and 6C, the illustrated sequence of requests is similar to the sequence shown in FIG. 7B, however, the timing of the write and read requests is reversed. In particular, FIG. 7D shows a sequence that includes a read request, a refresh request and then a write request (i.e., a read-then-refresh-then-write sequence). This sequence results in the performance of read operations, then refresh operations and then write operations. In this case, the order in which the requests are queued is also the order in which operations associated with the requests are performed, with no requests being taken out of order because of a higher queue priority.

Figure 7E:
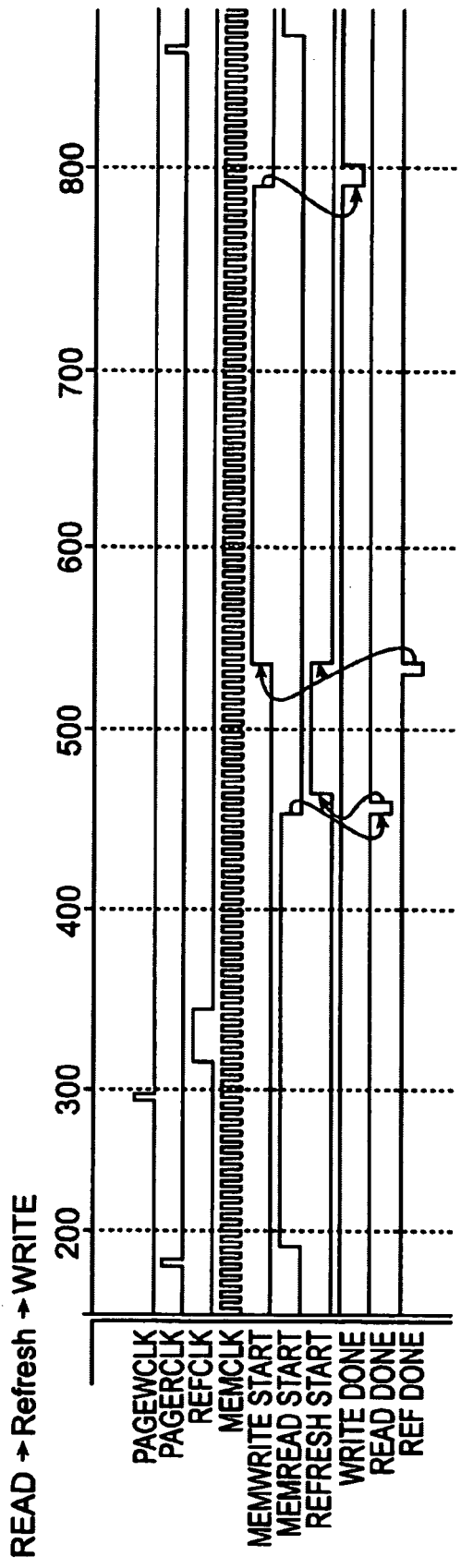

In FIGS. 7E and 6C, the illustrated sequence of requests includes a read request, a write request and a refresh request (i.e., a read-then-write-then-refresh sequence). This sequence results in the performance of read operations, then refresh operations and then write operations. The refresh operations are performed before the write operations because the refresh request was made prior to completion of the read operations and the refresh request has higher queue priority relative to a queued write request.

Figure 7F:
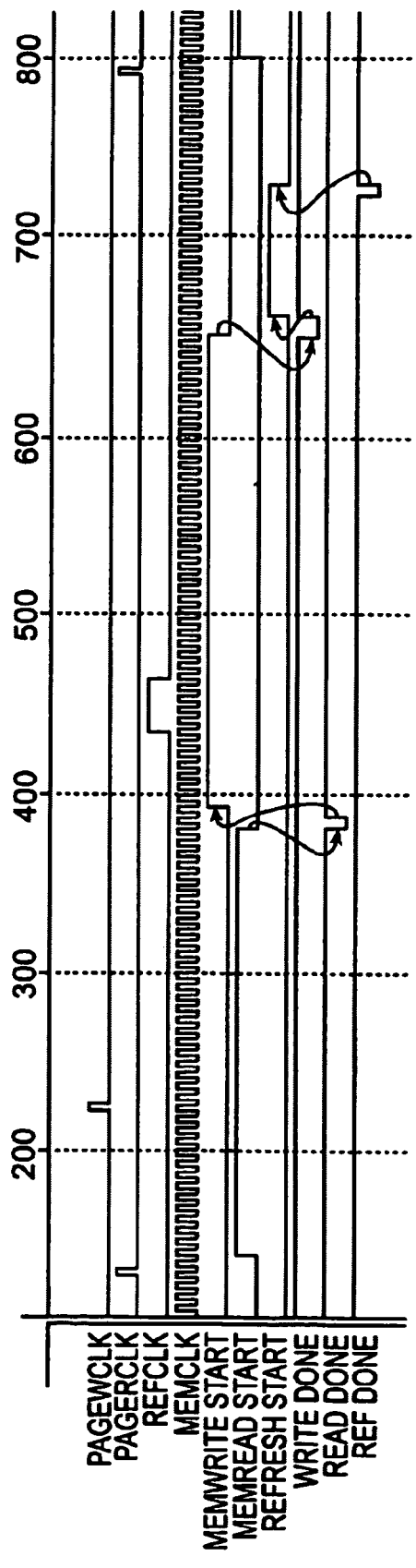

In FIGS. 7F and 6C, the illustrated sequence of requests includes a read request, a write request and then a late refresh request (i.e., a read-then-write-then-refresh sequence). This sequence results in the performance of read operations, then write operations and then refresh operations. In this case, the order in which the requests are queued is also the order in which operations associated with the requests are performed. In particular, because the refresh request occurs after completion of the read operations, the earlier queued write request results in the commencement of write operations upon completion of the read operations.

Figures 7G, 7H:
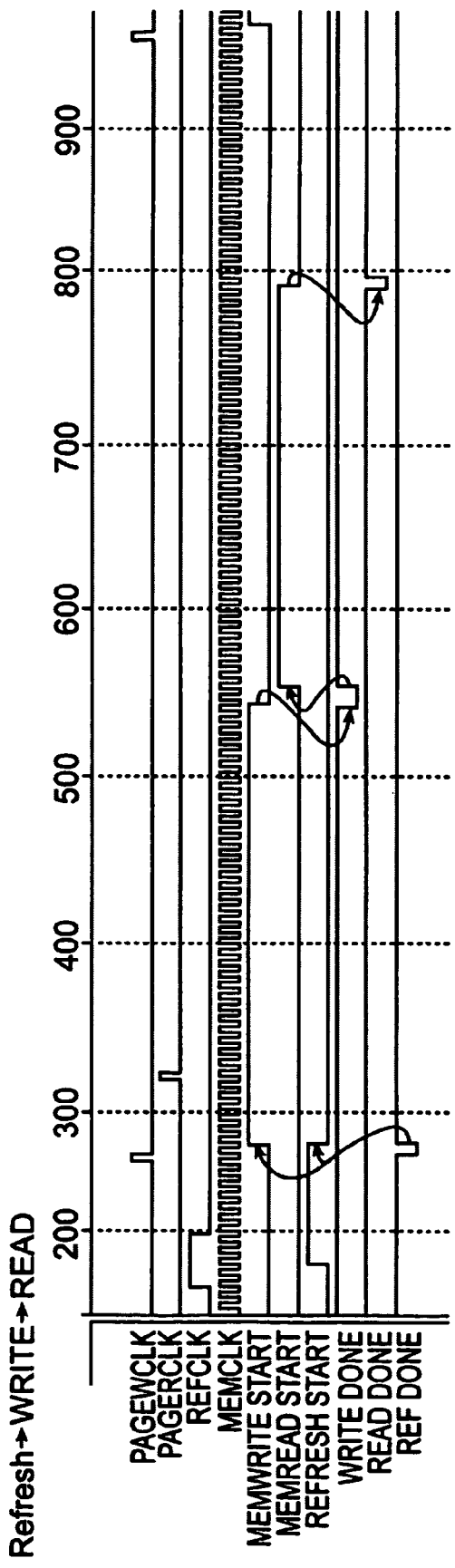

In FIGS. 7G and 6D, the illustrated sequence of requests includes a refresh request, a write request and a read request (i.e., a refresh-then-write-then-read sequence). This sequence results in the performance of refresh operations, then write operations and then read operations in the same sequence as the request signals are generated. Finally, in FIGS. 7H and 6D, the illustrated sequence of requests includes a refresh request, a read request and a write request (i.e., a refresh-then-read-then-write sequence). This sequence results in the performance of refresh operations, then read operations and then write operations in the same sequence as the request signals are generated.

Aspects of the FIFO controller 102 of FIG. 2 will now be described more fully with respect to FIG. 5. In particular, FIG. 5 illustrates a FIFO controller 102' having various arbitration control circuits and memory interface and control circuits therein. As illustrated by FIG. 5A, a multi-request arbitration circuit 500 is provided that generates a plurality of start signals: REFRESH_START, MEMREAD_START and MEMWRITE_START, which are illustrated by the timing diagrams of FIGS. 7A–7H. These start signals (commands) are received by a memory interface state machine 600 and the quad-port cache control circuit 14'. The refresh start signal (REFRESH_START) is generated in response to a refresh request signal (REFCLK) that is received by the arbitration circuit 500. The refresh request signal is generated by a refresh counter 502. This refresh counter is responsive to a clock signal (shown as CLK33M) and an active low global reset signal RSL. A preferred embodiment of this arbitration circuit 500 is more fully illustrated by FIGS. 8A–8B. The clock signal CLK33M may be an input clock signal having a frequency of 33.33 MHz. This clock signal may be used with a phase locked loop (PLL), now shown, to generate another clock signal (e.g., MEMCLK) having a frequency of 133.33 MHz or 166.67 MHz, for example.

The arbitration circuit 500 is responsive to a read request signal (READ_REQUEST) and a write request signal (WRITE_REQUEST), which are generated by a FIFO control circuit 15. These request signals are also illustrated as respective clocks signals PAGERCLK and PAGEWCLK in FIGS. 7A-7H. The arbitration circuit 500 is synchronized with a clock signal, shown as MEMCLOCK. This clock signal MEMCLOCK may have a frequency of about 166.67 MHz in some applications. The arbitration circuit 500 is also responsive to various signals that reflect completion of read, write and refresh operations. These "completion" signals are illustrated as WRITE_DONE, READ_DONE and REF_DONE.

The memory interface state machine 600 is configured to generate memory control signals (MEMORY_CONTROL) and data control signals (DATA_CONTROL) in response to the start signals. Moreover, the memory interface state machine 600 is configured to generate the WRITE_DONE, READ_DONE and REFRESH_DONE signals as active low pulses upon completion of the respective write, read and refresh operations. A memory interface control circuit 610 is also provided. This interface control circuit 610, which is responsive to the memory control signals, generates signals that are compatible with DRAM memory devices. These signals are illustrated as ADDR<12:0>, which represents a 13-bit row address, BANK<1:0>, which represents a bank select signal, and a plurality of single bit signals. These single bit signals are shown as a chip select signal (/CS), a column address strobe signal (/CAS), a write enable signal (/WE) and a row address strobe signal (/RAS). Different signals will be used in the event the DDR memory device 140 is an SRAM device.

Figure 5B:
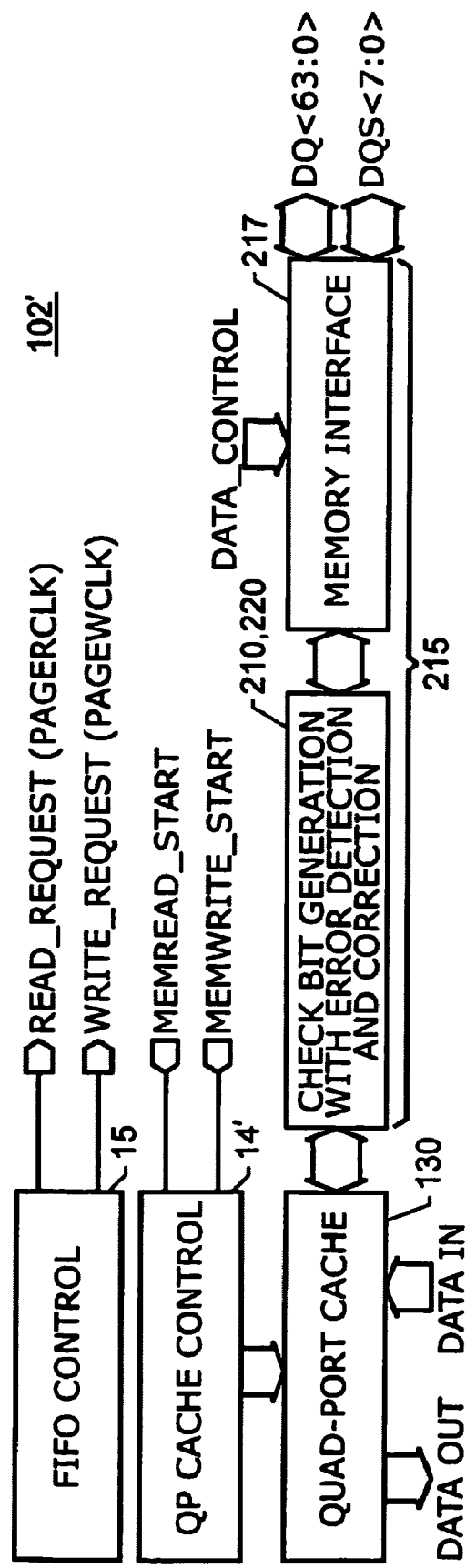
FIG. 5 is a block diagram that illustrates a read/write data path associated with the FIFO controller of FIG. 2.

Referring now to FIG. 5B, the quad-port cache 130 and data transfer control circuit 215 are illustrated. The data transfer control circuit 215 includes the check bit generation circuits 210 and error detection and correction circuits 220 illustrated in FIG. 2 and a memory interface circuit 217 that is responsive to the data control signals (DATA_CONTROL). The memory interface circuit 217 is coupled to the DDR memory device 140 by a data bus (shown as DQ<63:0>) and data strobe bus (shown as DQS<7:0>).

Figure 8A:
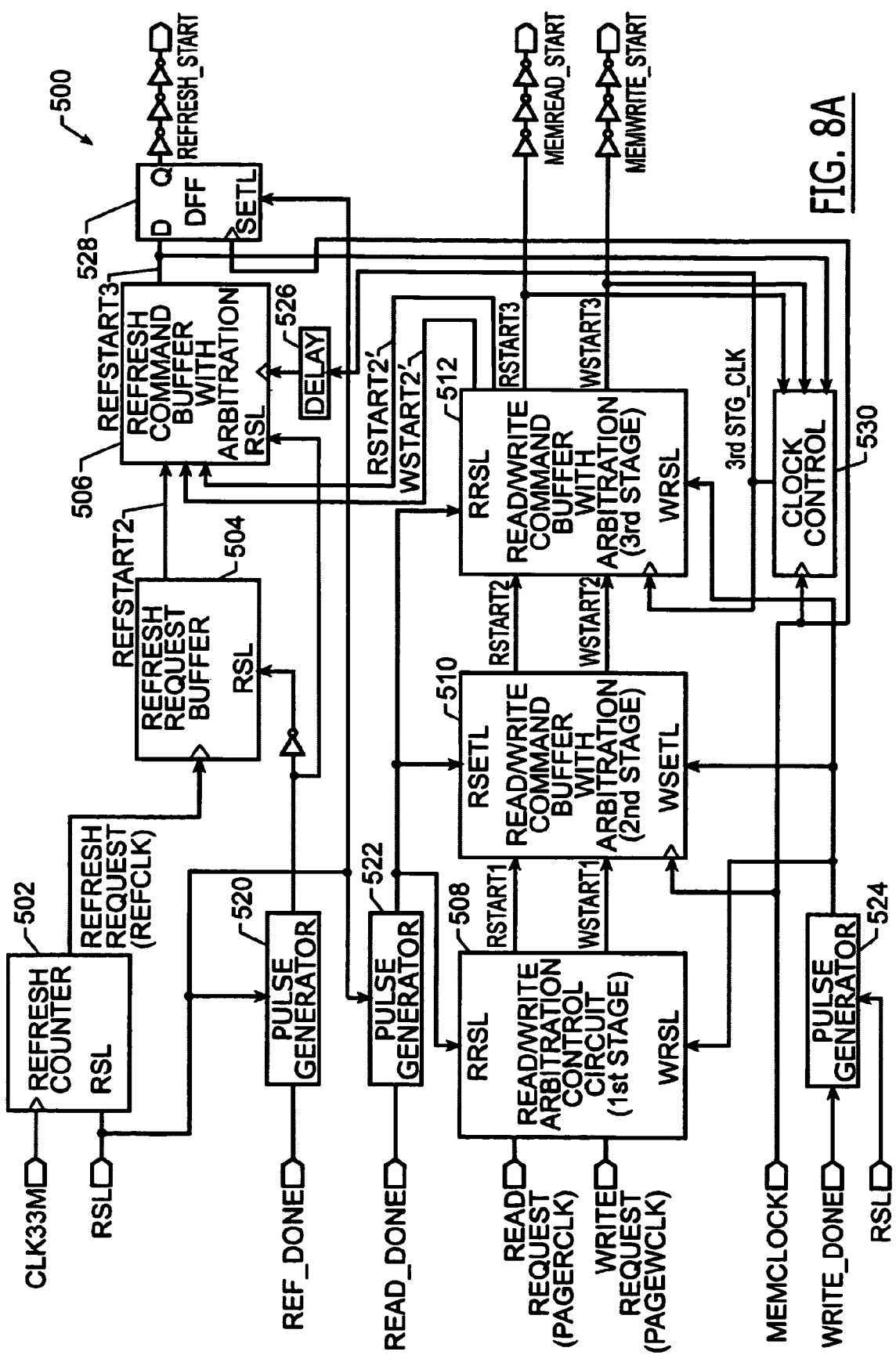
FIG. 8A is a block diagram of a request signal arbitration circuit according to embodiments of the present invention.
Figure 8B:
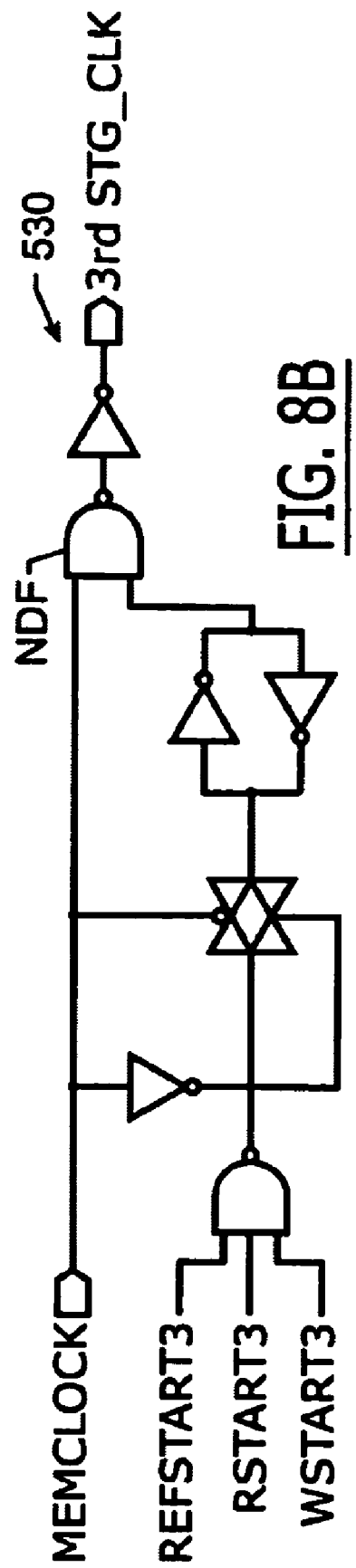
FIG. 8B is an electrical schematic of the clock control circuit of FIG. 8A.

FIGS. 8A and 8B illustrate a multi-stage arbitration control circuit 500 that may be used as the arbitration circuit 500 illustrated by FIG. 5. FIG. 8A also illustrates a refresh counter 502 that periodically generates a refresh request REFRESH REQUEST (shown as REFCLK in FIGS. 7A–7H). The multiple stages within the arbitration control circuit 500 include a read/write arbitration control circuit 508 (1st stage), a first read/write command buffer and arbitration circuit 510 (2nd stage) and a second read/write command buffer and arbitration circuit 512 (3rd stage). The read/write arbitration control circuit 508 is responsive to read and write request signals (READ REQUEST and WRITE REQUEST), which are also illustrated as PAGERCLK and PAGEWCLK in the timing diagrams of FIGS. 7A–7H. These request signals are asynchronously timed relative to each other by virtue of the fact that FIFO read operations and FIFO write operations are independently controlled by separate external clocks. In response to these request signals, the read/write arbitration control circuit 508 generates first arbitration results, which are shown as a first read start command (RSTART1) and a first write start command (WSTART1). These first arbitration results identify which of two request signals was first in time. The read/write arbitration control circuit 508 has two reset terminals, shown as RRSL (read reset low) and WRSL (write reset low). These terminals received reset pulses that are generated by a read reset pulse generator 520 and write reset pulse generator 524. The read reset pulse generator 520 is responsive to the global reset signal RSL and the READ_DONE signal, which is generated by the memory interface state machine 600 of FIG. 5A to signify completion of read operations. The write reset pulse generator 524 is responsive to the global reset signal RSL and the WRITE_DONE signal, which signifies completion of write operations.

The first read/write command buffer and arbitration circuit 510 (2nd stage) is configured to buffer and rearbitrate the first arbitration results (RSTART1 and WSTART1) and generate second arbitration results (RSTART2 and WSTART2) that confirm or, if necessary, correct the first arbitration results if timing jitter caused an erroneous initial result. The first read/write command buffer and arbitration circuit 510 is synchronized with a clock signal, shown as MEMCLOCK. Thus, the second arbitration results (RSTART2 and WSTART2) represent a transfer of the first arbitration results (RSTART1 and WSTART1) into a new clock domain (controlled by MEMCLOCK) that is asynchronously timed relative to the clock domains associated with the generation of the read and write request signals (PAGERCLK and PAGEWCLK). The first read/write command buffer and arbitration circuit 510 has two set terminals, shown as RSETL (read set low) and WSETL (write set low).

The second read/write command buffer and arbitration circuit 512 (3rd stage) is configured to buffer and rearbitrate the second arbitration results (RSTART2 and WSTART2) and generate third arbitration results (RSTART3 and WSTART3) that confirm or, if necessary, correct the second arbitration results. The second read/write command buffer and arbitration circuit 512 is synchronized with a third stage clock signal (3rd STG_CLK), which is generated by a clock control circuit 530. This clock control circuit is synchronized to the clock signal MEMCLOCK. The second read/write command buffer and arbitration circuit 512 has two reset terminals, shown as RRSL (read reset low) and WRSL (write reset low). As illustrated, the read start signal MEMREAD_START and the write start signal MEMWRITE_START are derived from the third arbitration results RSTART3 and WSTART3.

The refresh request signal REFRESH REQUEST is provided as a clock signal to a refresh request buffer 504, which has an active low reset terminal RSL. This refresh request buffer 504 generates an active high intermediate refresh start command REFSTART2 in response to a low-to-high transition of the refresh request signal. The refresh start command REFSTART2 is provided to a refresh command buffer and arbitration circuit 506, which has an active low reset terminal RSL. The refresh request buffer 504 and the refresh command buffer and arbitration circuit 506 are reset on opposite edges of a reset signal that is generated by a reset pulse generator 520. This reset pulse generator 520 is responsive to the REF_DONE signal, which is generated by the memory interface state machine 600 to signify completion of the refresh operations.

The refresh command buffer and arbitration circuit 506 arbitrates between three start commands and generates a third arbitration result (for refresh), shown as REFSTART3, in response to a plurality of intermediate start signals. These intermediate start signals are shown as REFSTART2, which is generated by the refresh request buffer 504, and RSTART2' and WSTART2', which are generated by the second read/write command buffer and arbitration circuit 512. The third arbitration result REFSTART3 is latched by a D-type flip-flop 528, which is synchronized with the clock signal MEMCLOCK. The D-type flip-flop 528 has an active low set terminal SETL, which receives the global reset signal RSL. As illustrated by FIG. 8B, the third arbitration results for refresh, read and write (i.e., REFSTART3, RSTART3 and WSTART3) control the timing of the third stage clock signal (3rd STG_CLK). In particular, only when all three final start commands: REFRESH_START, MEMREAD_START and MEMWRITE_START at set to inactive low levels (and REFSTART3=RSTART3=WSTART3=1), will the NAND gate NDF in FIG. 8B be enabled to pass the clock signal MEMCLOCK as the third stage clock signal 3rd STG_CLK. This third stage clock signal 3rd STG_CLK is provided to the refresh command buffer and arbitration circuit 506 after a short delay, which is provided by a delay circuit 526. Accordingly, only when all of the three start signals (REFSTART3, RSTART3 and WSTART3) are inactive at high levels will the second read/write command buffer and arbitration circuit 512 and the refresh command buffer and arbitration circuit 506 be enabled to generate a final refresh, read or write start command (REFRESH_START, MEMREAD_START, MEMWRITE_START), as illustrated by FIGS. 7A–7H.

Therefore, as described above, the multi-stage arbitration control circuit 500 can be used to arbitrate between first and second request signals (e.g., PAGERCLK and PAGEWCLK) generated in respective first and second clock domains that are asynchronously timed relative to each other. These arbitration operations are performed to obtain first arbitration results (e.g., RSTART1 and WSTART1) that identify a relative queue priority between the first and second request signals. These first arbitration results are also transferred into a third clock domain (e.g., MEMCLOCK) that is asynchronously timed relative to the first and second clock domains. This transfer operation may include arbitrating the first arbitration results in the third clock domain to obtain second arbitration results (e.g., RSTART2 and WSTART2) that confirm or correct the first arbitration results. To provide additional buffering to insure accuracy, the second arbitration results are rearbitrated in the third clock domain to obtain third arbitration results (e.g., RSTART3 and WSTART3) that confirm or correct the second arbitration results. The refresh command buffer and arbitration circuit 506 further arbitrates between a refresh start command and read and write start signals generated by said multi-stage arbitration control circuit, in order to generate another arbitration result (REFSTART3) that controls the timing of a refresh start command REFRESH_START.

Figure 9A:
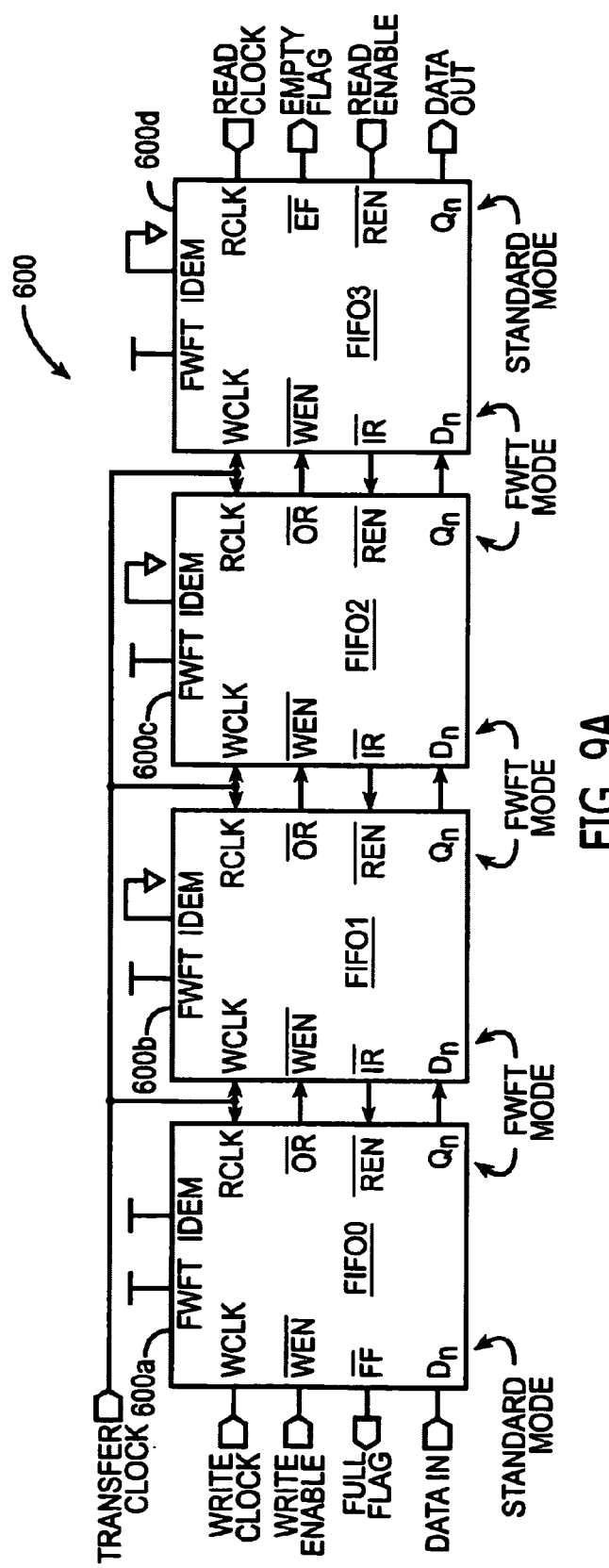
FIG. 9A is a block diagram of a plurality of FIFO memory devices that are arranged in a depth expansion configuration and collectively support standard mode operation.

Referring now to FIG. 9A, a plurality of FIFO memory devices 600a–600d (FIFO 0–FIFO 3) are arranged in a depth expansion configuration according to embodiments of the present invention. These devices collectively define a FIFO memory system 600 that supports standard mode operation. As illustrated by the write interface of the system 600, which is shown as the write interface of the first FIFO memory device 600a, and the read interface of the system 600, which is shown as the read interface of the last FIFO memory device 600d, the system 600 interfaces with a data supplying device (i.e., write side source, not shown) and a data receiving device (i.e., read side source, not shown) via interfaces that support standard mode operation. In contrast, the intermediate FIFO memory devices 600b and 600c are configured to support first-word fall-through (FWFT) mode operation at both their write and read interfaces. To support communication between the first FIFO memory device 600a and the second FIFO memory device 600b, the read interface of the first FIFO memory device 600a is configured to support FWFT mode operation. Similarly, to support communication between the third FIFO memory device 600c and the fourth FIFO memory device 600d, the write interface of the fourth FIFO memory device 600d is configured to support FWFT mode operation. These memory devices may be configured as FIFO memory chips that are independently packaged or multiple chips may be arranged in a depth expansion configuration within a single integrated circuit package.

Accordingly, in order for the FIFO memory devices 600a–600d to collectively support standard mode operation with respect to the data supplying device and the data receiving device, the first FIFO memory device 600a is set to support a first hybrid mode and the last FIFO memory device 600d is set to support a second hybrid mode. The first hybrid mode supports a write interface configured in standard mode and a read interface configured in FWFT mode and the second hybrid mode supports a write interface in FWFT mode and a read interface in standard mode.

This first hybrid mode is achieved by setting the FWFT pin on the first FIFO memory device 600a to a logic 1 value (e.g., Vdd) and setting the standard depth expansion mode pin (IDEM) to a logic 1 value. This first hybrid mode prevents any conflict between the generation of an empty flag (/EF) associated with an upstream device and write enable pin (/WEN) associated with an adjacent downstream device, by replacing an empty flag generation associated with standard mode with an output ready flag generation associated with FWFT mode. The second hybrid mode is achieved by setting the FWFT pin on the last FIFO memory device 600d to a logic 0 value and setting the depth expansion mode pin IDEM pin on the last FIFO memory device to a logic 1 value. The second and third FIFO memory devices 600b and 600c are set in a full FWFT mode by setting the FWFT pin to a logic 1 value and setting the IDEM pin to a logic 0 value. A FIFO memory device (not shown) may be set in full standard mode, where both write and read interfaces support standard mode, by setting the FWFT pin to a logic 0 value and setting the IDEM pin to a logic 0 value. A transfer clock signal (TRANSFER CLOCK) may be provided as an independent high frequency clock signal (e.g., 166.7 MHz) or may constitute the write clock signal (WCLK) or read clock signal (RCLK). If the write or read clock signal is used as the transfer clock signal, then the write or read clock signal having the higher frequency should be used for better system performance.

Figure 9B:
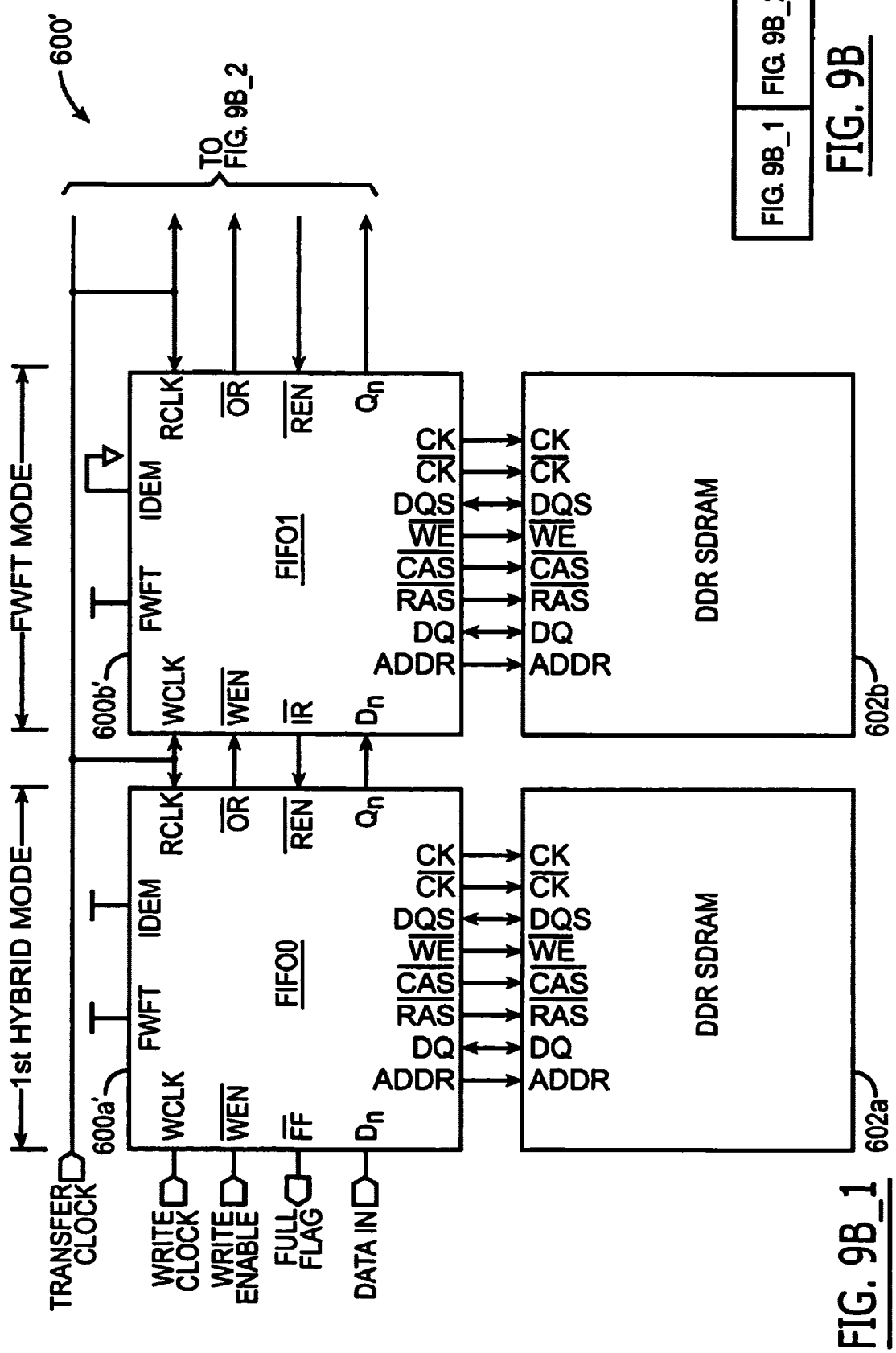
FIG. 9B is a block diagram of a plurality of FIFO memory controllers that are arranged in a depth expansion configuration and collectively support standard mode operation.

Referring now to FIG. 9B, a plurality of FIFO memory controllers 600a'–600d' are illustrated as being arranged in a depth expansion configuration. These FIFO memory controllers 600a'–600d' may be configured in accordance with the memory controllers of FIGS. 2–5. These controllers 600a'–600d' collectively define a FIFO memory system 600' that supports standard mode operation. As described above with respect to FIG. 9A, the first and last FIFO memory controllers 600a' and 600d' are configured in the first and second hybrid modes, respectively, and the intermediate FIFO memory controllers 600b' and 600c' are configured in the FWFT mode.

Each FIFO memory controller 600a'–600d' is electrically coupled to an external memory device using control and interface logic. These external memory devices 602a–602d are shown as dual data rate (DDR) synchronous dynamic random access memory (SDRAM) devices, however, other devices may be used. The pins at the external memory interface are illustrated as conventional pins: clock signal pins CK and /CK, data strobe signal pins DQS, write enable pin /WE, column address strobe pin /CAS, row address strobe pin /RAS, data pins (DQ) and address pins (ADDR). These external memory devices may be configured to perform the same functions as embedded memory arrays within the FIFO memory devices 600a–600d of FIG. 9A. As used herein and in the claims, the references to a FIFO memory device include FIFO memory devices having high capacity embedded memory and FIFO memory controllers that utilize external high capacity memory.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device, comprising:
a first-in first-out (FIFO) memory chip configured to support a pair of hybrid operating modes that enable the FIFO memory chip to be depth-expandable with other FIFO memory chips in a collective standard mode of operation, said pair of hybrid operating modes including a first hybrid mode that supports a write interface configured in standard mode and a read interface configured in first-word fall-through (FWFT) mode and a second hybrid mode that supports a write interface configured in FWFT mode and a read interface configured in standard mode.

2. The device of claim 1, wherein the first hybrid mode supports a write interface having a full flag pin that designates when said FIFO memory chip is full and a read interface having an output ready pin that designates when said FIFO memory chip has at least one entry therein.

3. The device of claim 2, wherein the second hybrid mode supports a write interface having an input ready pin that designates when said FIFO memory chip can accept additional entries and a read interface having an empty flag pin that designates when said FIFO memory chip is empty.

4. The device of claim 3, wherein said FIFO memory chip has a pin that is responsive to a standard depth expansion mode signal.

5. The device of claim 1, wherein said FIFO memory chip comprises a FIFO memory controller chip having cache memory arrays therein and a external memory interface that supports read and write data transfers between the cache memory arrays and a random access memory device.

6. The device of claim 1, wherein said FIFO memory chip comprises:
a first cache memory device having a first page of quad-port memory cells therein that is configured to support writing and reading of FIFO vectors to and from columns in the first page and writing and reading of memory vectors to and from rows in the first page.

7. An integrated circuit system, comprising:
a plurality of first-in first-out (FIFO) memory controller chips that collectively support standard mode operation when cascaded in a depth expansion configuration, said plurality of FIFO memory controller chips comprising:
a front-end FIFO memory controller chip disposed in a first hybrid mode that supports a corresponding write interface configured in standard mode and a corresponding read interface configured in first-word fall-through (FWFT) mode; and
a back-end FIFO memory controller chip disposed in a second hybrid mode that supports a corresponding write interface configured in FWFT mode and a corresponding read interface configured in standard mode.

8. An integrated circuit device, comprising:
a first-in first-out (FIFO) memory chip having cache and embedded memory elements therein, said FIFO memory chip configured to support a pair of hybrid operating modes that enable said FIFO memory chip to be depth-expandable with other FIFO memory chips in a collective standard mode of operation, said pair of hybrid operating modes including a first hybrid mode that supports a write interface configured in standard mode and a read interface configured in first-word fall-through (FWFT) mode and a second hybrid mode that supports a write interface configured in FWFT mode and a read interface configured in standard mode.

9. The device of claim 8, wherein the first hybrid mode supports a write interface having a full flag pin that designates when said FIFO memory chip is full and a read interface having an output ready pin that designates when said FIFO memory chip has at least one entry therein.

10. The device of claim 9, wherein the second hybrid mode supports a write interface having an input ready pin that designates when said FIFO memory chip can accept additional entries and a read interface having an empty flag pin that designates when said FIFO memory chip is empty.

11. The device of claim 10, wherein said FIFO memory chip has a pin that is responsive to a standard depth expansion mode signal.

12. An integrated circuit device, comprising:
a first-in first-out (FIFO) memory chip configured to support at least one hybrid operating mode that enables said FIFO memory chip to be depth-expandable with another FIFO memory chip in a collective standard mode of operation, said at least one hybrid mode supporting a write interface configured in standard mode and a read interface configured in first-word fall-through (FWFT) mode.

* * * * *